United States Patent
Motieian Najar et al.

(10) Patent No.: US 11,697,135 B2
(45) Date of Patent: Jul. 11, 2023

(54) MULTI-FREQUENCY HYBRID PIEZO ACTUATION AND CAPACTIVE TRANSDUCER

(71) Applicant: Texas Instruments Incorporated, Dallas, TX (US)

(72) Inventors: Mohammad Hadi Motieian Najar, Santa Clara, CA (US); Peter Smeys, San Jose, CA (US)

(73) Assignee: Texas Instruments Incorporated, Dallas, TX (US)

( * ) Notice: Subject to any disclaimer, the term of this patent is extended or adjusted under 35 U.S.C. 154(b) by 1239 days.

(21) Appl. No.: 16/186,072

(22) Filed: Nov. 9, 2018

(65) Prior Publication Data

US 2020/0147642 A1    May 14, 2020

(51) Int. Cl.
*B06B 1/06*      (2006.01)
*B06B 1/02*      (2006.01)
*H10N 30/87*     (2023.01)
*H10N 30/88*     (2023.01)
*H10N 30/00*     (2023.01)

(52) U.S. Cl.
CPC .......... *B06B 1/0622* (2013.01); *B06B 1/0215* (2013.01); *H10N 30/1071* (2023.02); *H10N 30/87* (2023.02); *H10N 30/88* (2023.02)

(58) Field of Classification Search
CPC ... B06B 1/0622; B06B 1/0215; H01L 41/047; H01L 41/053; H01L 41/085
See application file for complete search history.

(56) References Cited

U.S. PATENT DOCUMENTS

| | | |
|---|---|---|
| 6,974,417 B2 | 12/2005 | Lockwood et al. |
| 9,112,374 B2 | 8/2015 | Ivanov |
| 9,716,446 B2 | 7/2017 | Gong et al. |
| 9,834,433 B2 | 12/2017 | Chang et al. |
| 9,941,722 B2 | 4/2018 | Ivanov |
| 9,970,831 B2 | 5/2018 | Shih |
| 2011/0227543 A1 | 9/2011 | Ivanov |
| 2011/0248603 A1 | 10/2011 | Tezuka et al. |
| 2012/0172721 A1 | 7/2012 | Curra et al. |
| 2013/0060140 A1 | 3/2013 | Sinelnikov |
| 2013/0069484 A1 | 3/2013 | Hynynen et al. |
| 2013/0088123 A1 | 4/2013 | Haskett |
| 2013/0144165 A1 | 6/2013 | Ebbini et al. |
| 2014/0058293 A1 | 2/2014 | Hynynen et al. |
| 2014/0375171 A1 | 12/2014 | Tai |
| 2015/0257734 A1 | 9/2015 | Chaggares |
| 2015/0358740 A1* | 12/2015 | Tsai ...................... G01N 29/36 73/632 |

(Continued)

OTHER PUBLICATIONS

Ultrasonic Transducer, From Wikipedia, retrieved Nov. 22, 2016, 2 pages.

*Primary Examiner* — Bryan P Gordon
(74) *Attorney, Agent, or Firm* — Valerie M. Davis; Frank D. Cimino

(57) ABSTRACT

In one embodiment, a transducer comprises a first piezoelectric stack comprising a piezoelectric material; a first layer in contact with the piezoelectric stack; and a base structure beneath the first layer. The first layer has a first displacement between a first portion of the base structure and the first layer, and the first displacement is configurable by a first bias voltage received by the transducer.

17 Claims, 13 Drawing Sheets

(56) References Cited

U.S. PATENT DOCUMENTS

| | | | |
|---|---|---|---|
| 2016/0107194 A1* | 4/2016 | Panchawagh | G01S 7/5208 310/317 |
| 2016/0157818 A1* | 6/2016 | Cho | A61B 8/4444 600/443 |
| 2017/0288576 A1 | 10/2017 | Gong et al. | |
| 2018/0141804 A1 | 5/2018 | Chang et al. | |
| 2018/0231423 A1 | 8/2018 | Shih | |

* cited by examiner

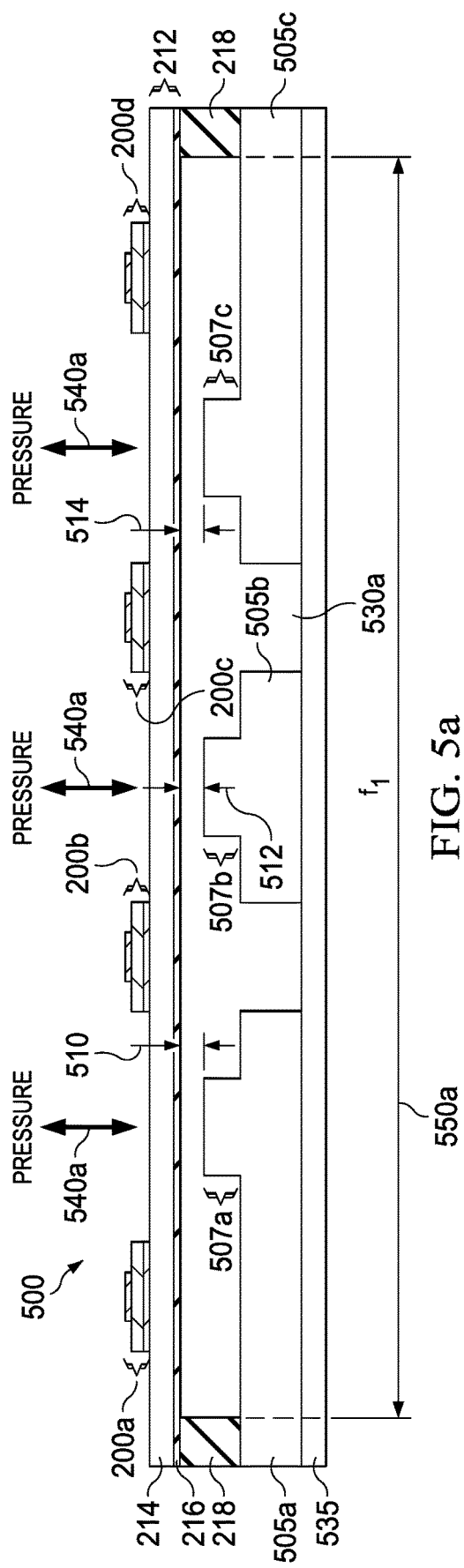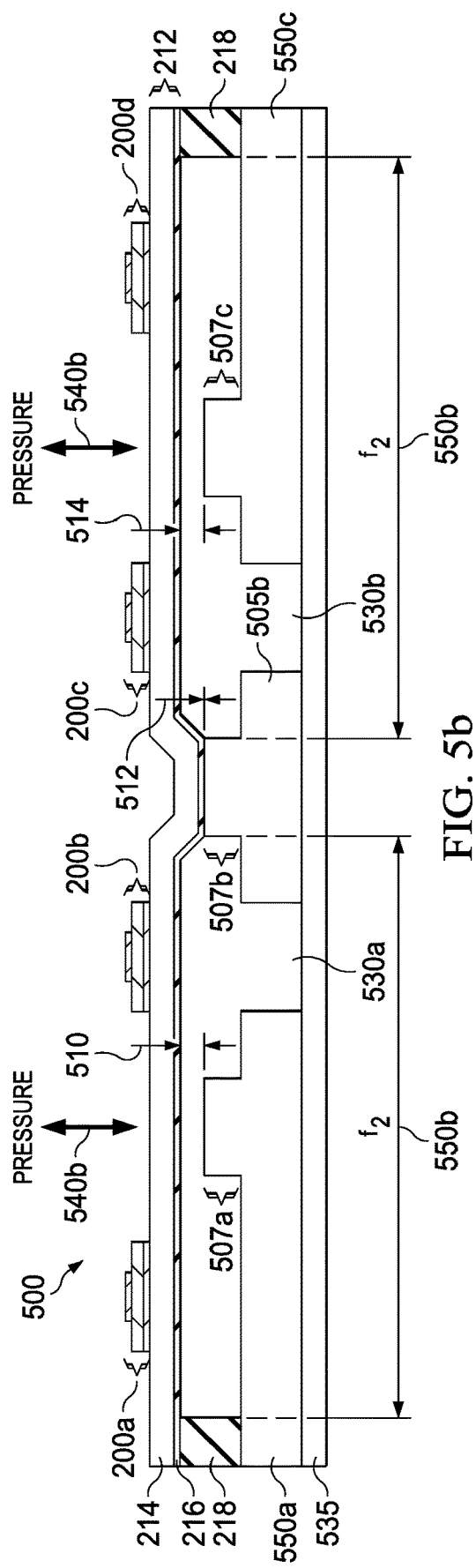

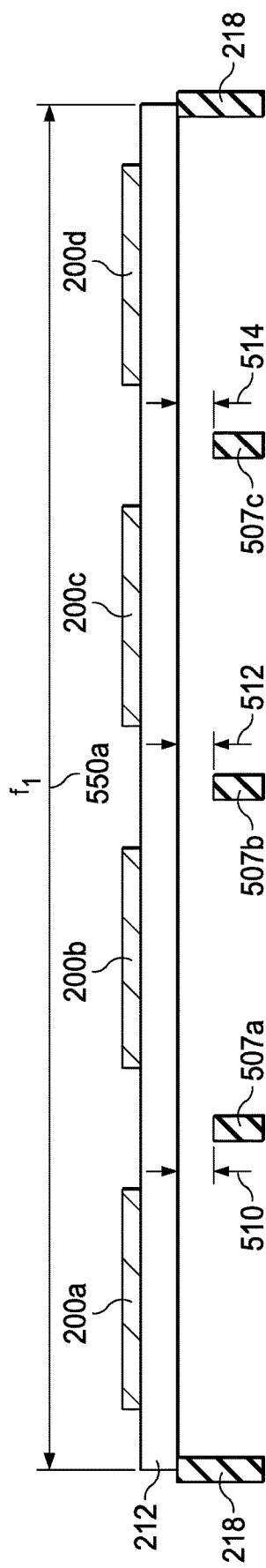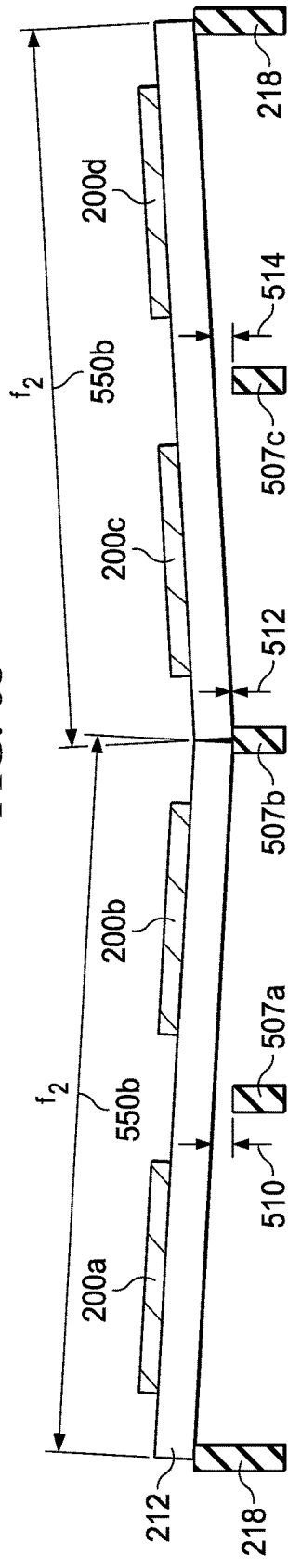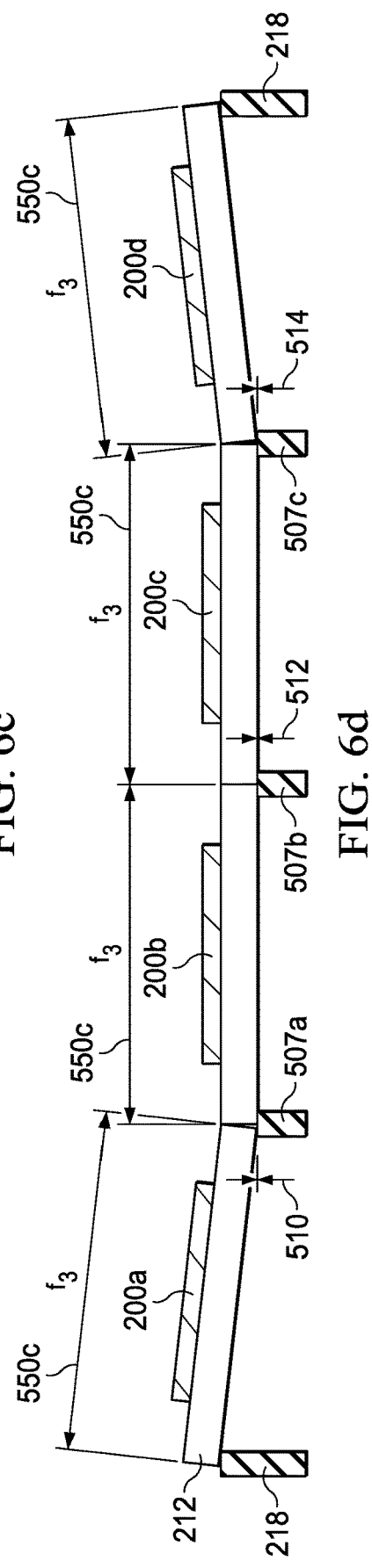

MULTI-FREQUENCY HYBRID PIEZO ACTUATION AND CAPACITIVE TRANSDUCER

TECHNICAL FIELD

This disclosure generally relates to ultrasound transducers and, in particular, multi-frequency ultrasound transducers.

BACKGROUND

An ultrasound transducer is a type of acoustic sensor that may transmit and/or receive ultrasound signals at a particular frequency. Typically, an ultrasound transducer on a single footprint may transmit and/or receive an ultrasound signal at one frequency. To transmit multiple ultrasound signals at different frequencies, the ultrasound transducer may have multiple footprints and complex signal conditioning.

SUMMARY OF PARTICULAR EMBODIMENTS

In one embodiment, a transducer comprises a first piezoelectric stack comprising a piezoelectric material; a first layer in contact with the piezoelectric stack; and a base structure beneath the first layer. The first layer has a first displacement between a first portion of the base structure and the first layer, and the first displacement is configurable by a first bias voltage received by the transducer.

The disclosure may present several technical advantages. For example, in certain embodiments, a technical advantage of the multi-frequency ultrasound transducer is providing multiple ultrasound signals at different frequencies within a limited size, such as within a single footprint. In particular, the multi-frequency ultrasound transducer may limit the number of drive electrodes required to produce multiple ultrasound frequencies and the number of receiving electrodes required to receive multiple ultrasound frequencies. As a non-limiting implementation example, an object detection system may utilize the multiple ultrasound signals from the space-saving multi-frequency ultrasound transducer to detect short and long-range objects. Moreover, in certain embodiments, another technical advantage of the multi-frequency ultrasound transducer may include reducing the complexity of signal conditioning required to transmit and/or receive multiple ultrasound signals at different frequencies. In addition, in certain embodiments, the dual detection of certain ultrasound frequencies may provide additional accuracy in detecting ultrasound signals, and may even provide a higher signal level of the transmitted and/or received ultrasound signal.

Other technical advantages of the present disclosure will be readily apparent to one skilled in the art from the following figures, descriptions, and claims. Moreover, while specific advantages have been enumerated above, various embodiments may include all, some, or none of the enumerated advantages.

Moreover, the embodiments disclosed herein are only examples, and the scope of this disclosure is not limited to them. Particular embodiments may include all, some, or none of the components, elements, features, functions, operations, or steps of the embodiments disclosed above. Embodiments are in particular disclosed in the attached claims, wherein any feature mentioned in one claim category, e.g., method, can be claimed in another claim category, e.g. system, as well.

BRIEF DESCRIPTION OF THE DRAWINGS

Aspects of the disclosure may be implemented in certain parts, steps, and embodiments that will be described in detail in the following description and illustrated in the accompanying drawings in which like reference numerals indicate similar elements. It will be appreciated with the benefit of this disclosure that the steps illustrated in the accompanying figures may be performed in other than the recited order and that one or more of the steps disclosed may be optional. It will also be appreciated with the benefit of this disclosure that one or more components illustrated in the accompanying figures may be positioned in other than the disclosed arrangement and that one or more of the components illustrated may be optional.

FIGS. 5A-C illustrate exemplary cross-sectional views of an ultrasound transducer.

FIGS. 6A-D illustrate an example array of electrodes capable of producing at least three ultrasound signals at separate frequencies.

DESCRIPTION OF EXAMPLE EMBODIMENTS

An ultrasound transducer is a type of acoustic sensor that may transmit and/or receive ultrasound signals at a particular frequency. Typically, an ultrasound transducer on a single footprint may transmit and/or receive an ultrasound signal at one frequency. To transmit multiple ultrasound signals at different frequencies, the ultrasound transducer must have multiple footprints and complex signal conditioning.

As sensor applications requiring ultrasound transducers (e.g., object detection mechanisms) become more prevalent and complicated in modern-day systems (e.g., autonomous vehicles), having an ultrasound transducer that limits its footprint while allowing for the transmission and/or reception of ultrasound signals at multiple frequencies becomes advantageous. For example, a hybrid micromachined ultrasound transducer as described in U.S. patent application Ser. No. 15/664,637 (filed on Jul. 31, 2017 and is hereby fully incorporated herein by reference for all purposes) generates an ultrasound signal at a single frequency in a limited footprint.

To allow for the transmission and/or reception of ultrasound signals at different frequencies, this disclosure describes one or more multi-frequency ultrasound transducers that utilize piezo actuation and electrostatic capacitance to transmit and/or receive multiple ultrasound signals at different frequencies. In one embodiment, a transducer comprises a first piezoelectric stack comprising a piezoelectric material; a first layer in contact with the piezoelectric stack; and a base structure beneath the first layer. The first layer has a first displacement between a first portion of the base structure and the first layer, and the first displacement is configurable by a first bias voltage received by the transducer.

Figure 1:
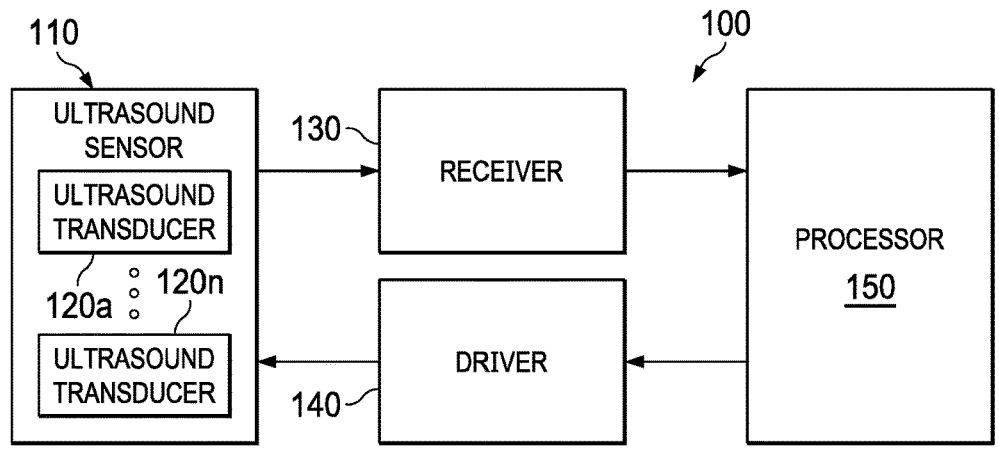
FIG. 1 illustrates an exemplary ultrasound transducer environment comprising an ultrasound sensor, a receiver, a driver, and a processor.

FIG. 1 illustrates exemplary ultrasound transducer environment 100 comprising ultrasound sensor 110, receiver 130, driver 140, and processor 150. Ultrasound sensor 110 may comprise one or more ultrasound transducers 120a-n.

Ultrasound sensor 110 may be any component that transmits and/or receives ultrasound signals at multiple frequencies. For example, ultrasound sensor 110 may receive an electrical signal from processor 150 (via driver 140), and may convert the electrical signal to an ultrasound signal. Similarly, as another example, ultrasound sensor 110 may receive an ultrasound signal from the exterior environment, and may convert the ultrasound signal to an electrical signal for processor 150 (via receiver 130). In certain embodiments, ultrasound sensor 110 may transmit an ultrasound signal at a first time and receive an echo of the ultrasound signal at a second time. By measuring a time between sending an ultrasound signal and receiving an echo of the ultrasound signal, processor 150 may calculate a distance and/or structural information of an object in some embodiments.

Ultrasound sensor 110 may comprise one or more ultrasound transducers 120a-n. For example, ultrasound sensor 110 may include thousands of ultrasound transducers 120a-n. Each ultrasound transducers 120a-n is capable of converting an electrical signal into an acoustic signal and converting an acoustic signal into an electrical signal. As discussed in more detail in FIGS. 2A-B and 5A-B, ultrasound transducers 120a-n transmits and/or receives ultrasound signals at various frequencies. To be able to transmit and/or receive ultrasound signals at various frequencies, ultrasound transducers 120a-n utilize both piezoelectric electrodes and capacitive electrodes.

The piezoelectric electrodes contain piezoelectric crystals that change size and shape when a voltage is applied. To produce an ultrasound signal, the piezoelectric electrodes oscillate at the same frequency when a piezoelectric voltage (e.g., an alternating current ("AC") voltage) is applied. On the other hand, piezoelectric electrodes generate a voltage when a force is applied to the electrodes, thereby allowing the piezoelectric electrodes to detect an ultrasound signal.

The capacitive electrodes create an electrostatic field between a conductive diaphragm and a plate. By changing the shape of the transmitting area for ultrasound transducers 120a-n, the capacitive electrodes can change the frequency of the ultrasound signal based on the displacement between the conductive diaphragm and plate. Moreover, because the capacitance between the conductive diaphragm and plate vary based on the ultrasound signal applied to the conductive diaphragm, ultrasound transducers 120a-n can detect an ultrasound signal.

Receiver 130 may include receiver circuitry that receives electrical signals generated by the ultrasound transducers 120a-n in response to incident acoustic energy. Receiver 130 may also include analog processing circuitry that manipulates the signal output for receiver 130. In some embodiments, receiver 130 includes low noise amplifiers and amplifier gain control circuitry (e.g., variable gain amplifiers and associated control). In some embodiments, receiver 130 includes filters (e.g., anti-alias filters) and analog-to-digital conversion circuitry to digitize the received ultrasound signals. In certain embodiments, receiver 130 and/or the functionality of receiver 130 may be incorporated in ultrasound sensor 110 or processor 150.

Driver 140 provides electrical signals to induce generation of acoustic signals by ultrasound sensor 110. In particular, driver 140 may provide varying piezoelectric voltages and bias voltages to ultrasound sensor 110 (and in particular ultrasound transducers 120a-n) to alter the frequency of the ultrasound signal that ultrasound sensor 110 is transmitting and/or receiving. Driver 140 may provide varying piezoelectric voltages and bias voltage to ultrasound sensor 110 after receiving an instruction to transmit a certain type of signal from processor 150. In particular embodiments, bias voltage may be a voltage difference between top plate 214 and base structure 220. Bias voltage, in particular, may be applied to ultrasound sensor 110 as a direct current ("DC") voltage. Each of the drivers 140 drives one or more of the ultrasound transducers 120a-n in ultrasound sensor 110. In some embodiments, driver 140 includes filters and digital-to-analog conversion circuitry to convert digital signals from processor 150 to electrical signals for inducing acoustic signals by ultrasound sensor 110. In certain embodiments, driver 140 and/or the functionality of driver 140 may be incorporated in ultrasound sensor 110 or processor 150.

Processor 150 controls the generation of transducer drive signals by driver 140, and processes the received ultrasound signals provided by receiver 130. Processor 150 may include transmit and/or receive beamforming circuitry to focus the transmitted and/or received ultrasound signals, brightness mode ("B-mode") imaging, color Doppler mode imaging circuitry, and/or other processing circuitry to manipulate image data and present images on a display device for viewing and interpretation by a user. In addition, processor 150 may include processing circuitry to calculate time-of-distance using the time of transmitting ultrasound frequencies transmitted from ultrasound sensor 110 and time of receiving reflected ultrasound frequencies by ultrasound sensor 110. Using the time-of-distance, processor 150 may accurately estimate the distance and/or structural information of one or more objects that are reflecting the ultrasound frequencies. In additional embodiments, processor 150 may also use amplitude and phase information from reflected acoustic waves to provide structural and functional information about an object of interest.

Processor 150 may generate instructions that driver 140 uses to control the operation of ultrasound sensor 110. The instructions can be stored in a computer readable medium, such as a semiconductor memory device, a magnetic or optical storage device, or other storage device accessible to the processor. In certain embodiments, at least some of the operations of processor 150 are implemented in dedicated hardware circuitry, such as an application specific integrated circuit ("ASIC") or field programmable gate array ("FPGA").

Figure 2A:
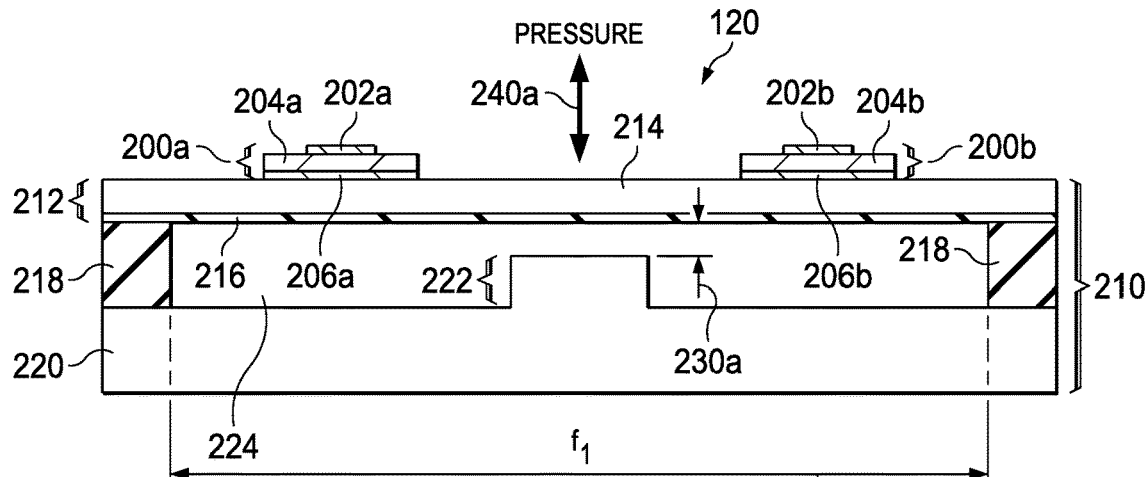
FIGS. 2A-B illustrate exemplary cross-sectional views of a dual-frequency transducer.

In an exemplary embodiment, ultrasound transducer 120, as shown in FIG. 2A, operates at multiple frequencies in a single footprint by using piezo actuation and electrostatic capacitance. Ultrasound transducer 120 may have a base structure with a first displacement between a first portion of the base structure and the first layer. Ultrasound transducer 120 may transmit a first ultrasound frequency as a first signal by driver 140 applying a first piezoelectric voltage to an electrode coupled to the piezoelectric material in ultrasound transducer 120.

Ultrasound transducer 120 may receive a reflection of the first ultrasound frequency through the piezoelectric material as a second signal. In certain embodiments, ultrasound transducer 120 receives a reflection of the first ultrasound frequency via the piezoelectric material and the capacitive transducer. Ultrasound sensor 110 may communicate the reflection of the first ultrasound frequency to receiver 130, and receiver 130 may in turn digitize and transmit the reflection of the first ultrasound frequency to processor 150.

Ultrasound transducer 120 may transmit a second ultrasound frequency as a third signal by driver 140 applying a bias voltage to ultrasound transducer 120 and a second piezoelectric voltage to an electrode coupled to the piezoelectric material in ultrasound transducer 120. Moreover, the bias voltage applied by driver 140 may alter the first displacement such that the first portion of the base structure is in contact with the first layer; however, a second portion of the base structure may still not be in contact with the first layer. In certain embodiments, the second ultrasound frequency is greater than the first ultrasound frequency.

Similarly, ultrasound transducer 120 may receive a reflection of the transmitted second ultrasound frequency through the piezoelectric material as a fourth signal. Specifically, ultrasound transducer 120 may receive a reflection of the transmitted second ultrasound frequency through the piezoelectric material while driver 140 applies a bias voltage to ultrasound transducer 120. Ultrasound sensor 110 may communicate the fourth signal to receiver 130, and receiver 130 may in turn digitize and transmit the fourth signal to processor 150.

In certain embodiments, ultrasound transducer 120 may transmit a third ultrasound frequency as a fifth signal by driver 140 applying a second bias voltage to ultrasound transducer 120 and applying a third piezoelectric voltage to an electrode coupled to the piezoelectric material in ultrasound transducer 120. Ultrasound transducer 120 may have a second displacement between a second portion of the base structure and the first layer. Upon receiving instructions from processor 150, driver 140 may alter second displacement by applying second bias voltage to ultrasound transducer 120, such that the second portion of the base structure is in contact with the first layer.

In addition, ultrasound transducer 120 may receive a reflection of the transmitted third ultrasound frequency through the piezoelectric material as a sixth signal. Specifically, ultrasound transducer 120 may receive a reflection of the transmitted third ultrasound frequency through the piezoelectric material while driver 140 applies a second bias voltage to ultrasound transducer 120. Ultrasound sensor 110 may communicate the sixth signal to receiver 130, and receiver 130 may in turn digitize and transmit the sixth signal to processor 150. Ultrasound sensor 110 may communicate the reflection of the second ultrasound frequency to receiver 130, and receiver 130 may in turn digitize and transmit the reflection of the third ultrasound frequency to processor 150.

FIG. 2A illustrates a cross-sectional view of ultrasound transducer 120 in a first configuration. While not illustrated in FIGS. 2A-B, ultrasound transducer 120 may be a circular shape when viewed top-down. Ultrasound transducer 120 may comprise one or more piezoelectric stack 200a-b and capacitive stack 210. Piezoelectric stack 200a-b may comprise first electrode 202a-b, piezoelectric material 204a-b, and second electrode 206a-b; and capacitive stack 210 may comprise first layer 212 (with first layer 212 comprising top plate 214 and insulation layer 216), support structure 218, and base structure 220 with base structure protrusion 222. The space between base structure 220 and first layer 212 may form gap 224, and displacement 230a may form between base structure protrusion 222 of base structure 220 and first layer 212. Moreover, pressure point 240a depicts the focal point of transmission and reception of an ultrasound signal at a first frequency for ultrasound transducer 120 in the first configuration. While ultrasound transducer 120 may be a circular shape when viewed top-down, ultrasound transducer 120 may be any shape that comprises piezoelectric stack 200a-b and capacitive stack 210. For example, the top-down shape of ultrasound transducer 120 may be rectangular, circular, or an octagon. In certain embodiments, the first configuration of ultrasound transducer 120 occurs because ultrasound transducer 120 does not receive a bias voltage above a bias voltage threshold. In particular, the first embodiment of ultrasound transducer 120 may occur because the voltage difference between first layer 212 and base structure 220 is below a bias voltage threshold.

Piezoelectric stack 200a-b is a transducer that converts mechanical vibrations, caused by ultrasound signals, to electrical pulses and converts electrical pulses to mechanical vibrations through piezo actuation. To accomplish converting mechanical vibrations to electrical pulses and electrical pulses to mechanical vibrations, piezoelectric stack 200a-b comprises first electrode 202a-b, second electrode 206a-b, and piezoelectric material 204a-b between first electrode 202a-b and second electrode 206a-b. As illustrated by the cross-sectional views of FIGS. 2A-B, piezoelectric stack 200a-b may be a circular piezoelectric stack. In other words, piezoelectric stack 200a illustrates a first cross-sectional slice of the circular piezoelectric stack and piezoelectric stack 200b illustrates a second cross-sectional slice of the same circular piezoelectric stack.

First electrode 202a-b and second electrode 206a-b are conductive materials that receive a voltage when a force is applied to piezoelectric material 204. Specifically, piezoelectric material 204 exerts an internal electrical field that exists on first electrode 202a-b and second electrode 206a-b when receiving pressure caused by ultrasound transducer 120 receiving an ultrasound signal. On the other hand, first electrode 202a-b and second electrode 206a-b may create an internal electrical field that causes piezoelectric material to exert pressure, thereby causing ultrasound transducer 120 to transmit an ultrasound signal. First electrode 202a-b and/or second electrode 206a-b may be connected to receiver 130 to receive an ultrasound signal through piezoelectric stack 200a-b. Similarly, first electrode 202a-b and/or second electrode 206a-b may be connected to driver 140 to transmit an ultrasound signal through piezoelectric stack 200a-b when driver 140 transmits a piezoelectric voltage (e.g., an AC voltage) to first electrode 202a-b and/or second electrode 206a-b. In certain embodiments, first electrode 202a-b and/or second electrode 206a-b can be formed from any electrically conductive material using various techniques on each side of the piezoelectric material 204a-b. First electrode 202a-b and/or second electrode 206a-b can be formed from one or more layers of metal such as gold, silver, molybdenum, platinum, palladium, iridium, copper, aluminum, titanium, and/or any alloy thereof. In certain embodiments, first electrode 202a-b and/or second electrode 206a-b can be formed from a silicon-based material such as silicon and/or silicon nitride that may or may not be doped or coated with a thin layer of metal.

Figure 2B:
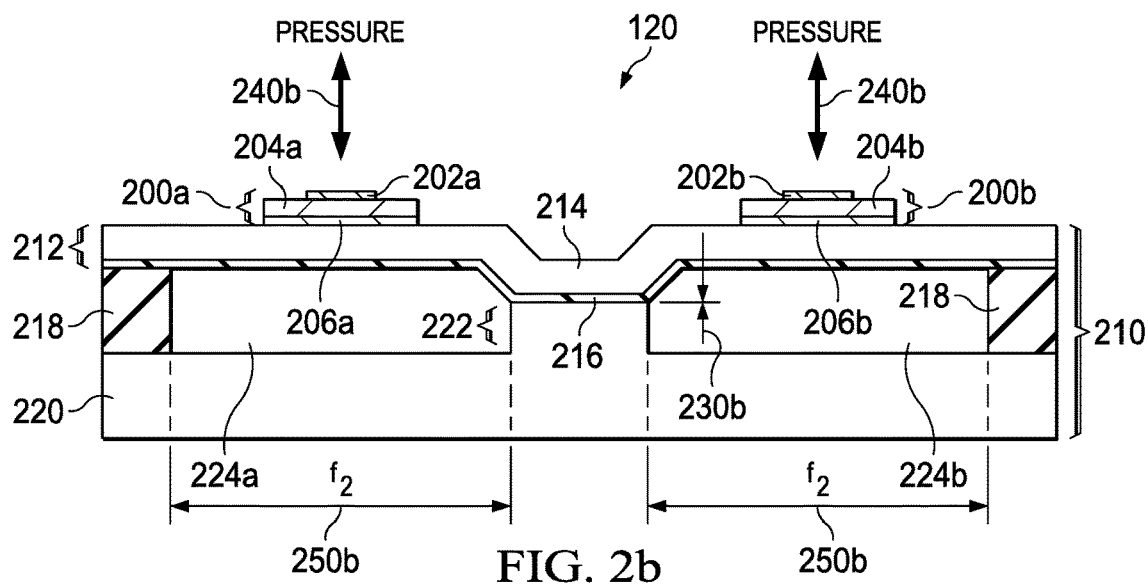

Similar to piezoelectric stack 200a-b and as illustrated by the cross-sectional views of FIGS. 2A-B, first electrode 202a-b may be a single electrode that is contained in a circular piezoelectric stack. In other words, first electrode 202a illustrates a first cross-sectional slice of the first electrode in a circular piezoelectric stack and first electrode 202b illustrates a second cross-sectional slice of the same first electrode in a circular piezoelectric stack.

Likewise, as illustrated by the cross-sectional views of FIGS. 2A-B, second electrode 206a-b may be a single electrode that is contained in a circular piezoelectric stack. In other words, second electrode 206a illustrates a first cross-sectional slice of the second electrode in a circular piezoelectric stack and second electrode 206b illustrates a second cross-sectional slice of the same first electrode in a circular piezoelectric stack.

Piezoelectric material 204a-b may be located between first electrode 202a-b and second electrode 206a-b. In certain embodiments, piezoelectric material 204a-b may comprise lead zirconate titanate, lead magnesium niobate-lead zirconate titanate, lead zirconate niobate-lead zirconate titanate, aluminum nitride, zinc oxide, quartz, tourmaline, ternary alloys such as scandium doped aluminum nitride, or any combination thereof. Piezoelectric material 204a-b may generate an electrical charge on first electrode 202a-b and second electrode 206a-b in response to an applied mechanical stress caused by ultrasound transducer 120 receiving an ultrasound signal. Similarly, piezoelectric material 204 may vibrate, causing ultrasound sound transducer 120 to transmit an ultrasound signal, in response to receiving an applied electrical signal from first electrode 202a-b and second electrode 206a-b.

Similar to piezoelectric stack 200a-b and as illustrated by the cross-sectional views of FIGS. 2A-B, piezoelectric material 204a-b may be a single piezoelectric material that is contained in a circular piezoelectric stack. In other words, piezoelectric material 204a illustrates a first cross-sectional slice of the piezoelectric material in a circular piezoelectric stack and piezoelectric material 204b illustrates a second cross-sectional slice of the same piezoelectric material in a circular piezoelectric stack.

Like piezoelectric stack 200a-b, capacitive stack 210 may act as a transducer in certain embodiments that converts mechanical vibrations, caused by receiving ultrasound signals, to electrical pulses through changes in capacitance. Similarly, capacitive stack 210 in certain embodiments may convert electrical pulses into mechanical vibrations, resulting in emitting ultrasound signals, by varying the capacitance. Capacitive stack 210 may comprise first layer 212 and base structure 220. First layer 212 and base structure 220 may act as two separate conductive plates, and first layer 212 may act as a flexible membrane. To convert a mechanical vibration to an electrical pulse, the mechanical vibration causes first layer 212 to vibrate, thereby changing the capacitance between first layer 212 and base structure 220. Through detection of the change of capacitance, processor 150 (via receiver 130) may detect the ultrasound signal. On the other hand, to convert an electrical pulse to a mechanical vibration, an alternating voltage is applied between first layer 212 and base structure 220. The resulting electrostatic forces cause vibration of first layer 212, thereby creating ultrasound signals that emit at the frequency of the modulation.

First layer 212 is a flexible membrane that may form the top plate of capacitive stack 210. First layer 212 may comprise top plate 214 and insulation layer 216. Top plate 214 may be any flexible material that acts as a capacitor plate. For example, top plate 214 may be formed of silicon. In certain embodiments, top plate 214 may be conductive and may receive a piezoelectric voltage and/or a bias voltage from driver 140. In certain embodiments, first layer 212 may come into contact with base structure 220 (e.g., base structure protrusion 222) when a voltage difference between top plate 214 and base structure 220 is above a certain bias voltage threshold. For example, the bias voltage threshold may be set at the voltage at which first layer 212 first comes into contact with base structure protrusion 222. In particular embodiments, bias voltage may be a voltage applied directly to top plate 214 and/or base structure 220. In addition, bias voltage may be applied as a DC voltage. Moreover, the bias voltage threshold may vary based on the size of base structure protrusion 222. For example, a larger indentation for base structure protrusion 222 may require a lower bias voltage threshold as the distance between base structure protrusion 222 and first player 212 is smaller. As another example, a smaller indentation (or even no indentation at all) for base structure protrusion 222 may require a higher bias voltage threshold as the distance between base structure protrusion 222 and first player 212 is larger.

Insulation layer 216 may exist below top plate 214. Insulation layer 216 may exist to ensure that base structure 220 and top plate 214 do not directly contact each other. Moreover, insulation layer 216 may also act as a buffer to ensure damage does not occur between base structure 220 and top plate 214 when first layer 212 comes into contact with base structure protrusion 222. In certain embodiments, insulation layer 216 is formed of silicon dioxide, silicon nitride, or any type of material that can withstand certain ultrasound frequencies.

Support structure 218 is any type of insulated material that separates base structure 220 from first layer 212. Support structure 218 may connect base structure 220 to first layer 212. In certain embodiments, support structure 218 is formed of silicon dioxide, silicon nitride, or any type of material that can withstand certain ultrasound frequencies.

Base structure 220 may comprise a conductive material that may receive a piezoelectric voltage and/or a bias voltage. For example, base structure 220 may be formed of silicon. In certain embodiments, first layer 212 may come into contact with base structure 220 (e.g., base structure protrusion 222) when a voltage difference between top plate 214 and base structure 220 is above a certain bias voltage threshold. In particular embodiments, bias voltage may be a voltage applied directly to base structure 220 and/or top plate 214. In addition, bias voltage may be applied as a DC voltage. In certain embodiments, an insulation layer may exist above base structure 220. In addition, in certain embodiments, base structure 220 may act as a flexible membrane Base structure 220 may also comprise base structure protrusion 222. Base structure protrusion 222 may be a structure that protrudes from base structure 220 towards first layer 212. In particular, base structure protrusion 222 is the area of base structure 220 that comes into contact with first layer 212 when a voltage difference between top plate 214 and base structure 220 is above a certain bias voltage threshold. In certain embodiments, first layer 212 (e.g., insulation layer 216) may come into contact with base structure protrusion 222 when a voltage difference between top plate 214 and base structure 220 is above a certain bias voltage threshold. For example, the bias voltage threshold may be set at the voltage at which first layer 212 first comes into contact with base structure protrusion 222.

Gap 224 exists because of the chasm between first layer 212 and base structure 220. By changing the shape of gap 224 for ultrasound transducer 120, ultrasound transducer 120 can transmit and/or receive ultrasound signals at different frequencies. Typically, a larger gap 224 produces a lower ultrasound frequency (e.g., first frequency 250a).

In addition, displacement 230a is a displacement between base structure protrusion 222 and first layer 212 (e.g., insulation layer 216). As depicted in FIG. 2A, displacement 230*a* exists between the first portion of base structure protrusion 222 and first layer 212. First layer 212 (e.g., insulation layer 216) may come into contact with base structure protrusion 222 when a voltage difference between first layer 212 and base structure 220 is above a certain bias voltage threshold. However, as depicted in FIG. 2A, the voltage difference between first layer 212 and base structure 220 is not above the bias voltage threshold. Accordingly, displacement 230*a* is a cavity that exists between base structure protrusion 222 and first layer 212.

Pressure point 240*a* depicts the focal point of transmission and reception of an ultrasound signal at a first frequency for ultrasound transducer 120 in the first configuration. Because a cavity exists at displacement 230*a*, the combination of pressure created by the piezoelectric stack 200*a-b* and capacitive stack 210 causes ultrasound signals to emit from and to be detected at pressure point 240*a*.

FIG. 2B illustrates a cross-sectional view of ultrasound transducer 120 in a second configuration. Ultrasound transducer 120 in FIG. 2B is similar in structure to ultrasound transducer 120 in FIG. 2A except first layer 212 is in contact with base structure 220. Unlike displacement 230*a* in FIG. 2A, displacement 230*b* in FIG. 2B is the lack of space between base structure protrusion 222 and first layer 212. In certain embodiments, displacement 230*b* may be a non-zero value such that base structure 220 and first layer 212 are separate. Portions that are not base structure protrusion 222 in base structure 220, however, may not be in contact with first layer 212 and may form multiple gaps 224*a-b*. Moreover, pressure points 240*b* depict the focal point of transmission and reception of an ultrasound signal at a second frequency for ultrasound transducer 120 in the second configuration. As depicted, pressure points 240*b* stem from piezoelectric stack 200*a-b* in the second configuration. In certain embodiments, the second configuration of ultrasound transducer 120 occurs because a voltage difference between top plate 214 and base structure 220 is above a certain bias voltage threshold. In particular, bias voltage may be a voltage applied directly to top plate 214 and/or base structure 220 such that the voltage difference between top plate 214 and base structure 220 is above a certain bias voltage threshold. In addition, bias voltage may be applied as a DC voltage.

In certain embodiments and as illustrated, first layer 212 may come into contact with base structure protrusion 222 when a voltage difference between top plate 214 and base structure 220 is above a certain bias voltage threshold. In particular, bias voltage may be a voltage applied directly to top plate 214 and/or base structure 220 such that the voltage difference between top plate 214 and base structure 220 is above a certain bias voltage threshold. The bias voltage may cause first layer 212 to contact base structure protrusion 222. In other words, first layer 212 may be electrostatically anchored to base structure protrusion 222 when either top plate 214 and/or base structure 220 receives a bias voltage above a certain bias voltage threshold. In certain embodiments, the bias voltage threshold may be set at the voltage at which first layer 212 first comes into contact with base structure protrusion 222. In addition, bias voltage may be applied as a DC voltage. As an example, bias voltage may be a DC voltage applied directly to top plate 214 and/or base structure 220 such that the voltage difference between top plate 214 and base structure 220 is above the bias voltage threshold.

Gaps 224*a-b* exist because of the wall that exists because several portions of base structure 220 and first layer 212 are not in contact with each other. By changing the shape of gaps 224*a-b* for ultrasound transducer 120, the frequency of ultrasound signals transmitted by ultrasound transducer 120 can be changed. Typically, a smaller gap produces a higher ultrasound frequency (e.g., second frequency 250*b*).

In addition, displacement 230*b* is the lack of space between base structure protrusion 222 and first layer 212 (e.g., insulation layer 216) in the second configuration. As depicted in FIG. 2B, displacement 230*b* illustrates the lack of space between base structure 220 (e.g., base structure protrusion 222) and first layer 212. First layer 212 (e.g., insulation layer 216) may come into contact with base structure protrusion 222 when a voltage difference between top plate 214 and base structure 220 is above a certain bias voltage threshold. As depicted in FIG. 2B, the voltage difference between first layer 212 and base structure 220 is above the bias voltage threshold. Accordingly, base structure protrusion 222 is in contact with first layer 212.

Pressure points 240*b* depict the focal point of transmission and reception of an ultrasound signal at a second frequency for ultrasound transducer 120 in the second configuration. Because a wall is formed at displacement 230*b*, piezoelectric stack 200*a-b* may emit ultrasound signals from pressure points 240*b* and/or receive ultrasound signals from pressure points 240*b*.

Notably, even if displacement 230*b* does not cause base structure protrusion 222 to contact first layer 212, the pressure points in FIG. 2B may be different than the pressure points in FIG. 2A so long as gap(s) 224 are altered. By changing the shape of the transmitting area (e.g., gap(s) 224) for ultrasound transducer 120, capacitive stack 210 can change the frequency of the ultrasound signal based on the displacement between the base structure 220 and first layer 212.

In an exemplary embodiment, ultrasound transducer 120 comprises piezoelectric stack 200*a-b* with each piezoelectric stack 200*a-b* comprising first electrode 202*a-b*, second electrode 206*a-b*, and piezoelectric material 204*a-b* between first electrode 202*a-b* and second electrode 206*a-b*. In addition, ultrasound transducer may also comprise first layer 212 (which may comprise of top plate 214 and insulation layer 216) with first layer 212 being in contact with piezoelectric stack 200*a-b*. Moreover, ultrasound transducer may further comprise base structure 220 that is beneath first layer 212. In specific embodiments, base structure 220 supports first layer 212 through support structure 218. A configurable displacement occurs between base structure 220 (and, in certain embodiments, base structure protrusion 222) and first layer 212. For example, displacement 230*a* may exist when a bias voltage does not exist between first layer 212 and base structure 220. As another example, displacement 230*b* may exist when a bias voltage exists between first layer 212 and base structure 220. Moreover, in certain embodiments, displacement 230*b* may be null when a bias voltage exists between first layer 212 and base structure 220, causing first layer 212 (and, in particular, insulation layer 216 of first layer 212) to contact base structure protrusion 222 of base structure 220. In certain embodiments, the bias voltage may be applied directly to base structure 220, base structure protrusion 222, and/or first layer 212. Moreover, when a bias voltage above a bias voltage threshold exists between first layer 212 and base structure 220, base structure protrusion 222 may contact first layer 212 whereas a second portion of base structure 220 may not be in contact with first layer 212. Multiple gaps 224*a-b* may exist as one of more second portions of base structure 220 (e.g., not base structure protrusion 222) do not come into contact with first layer 212.

In addition, as ultrasound transducer 120 is in a first configuration such that displacement 230a exists between first layer 212 and base structure protrusion 222, driver 140 may transmit a first piezoelectric voltage to piezoelectric stack 200a-b and/or capacitive stack 210. While the first piezoelectric voltage is received by ultrasound transducer 120, piezoelectric stack 200a-b and/or capacitive stack 210 may transmit an ultrasound frequency at a first frequency. In addition, when ultrasound transducer 120 is in a first configuration, ultrasound transducer 120 may also receive an ultrasound frequency at the first frequency and relay that signal to receiver 130.

Moreover, ultrasound transducer 120 may be in a second configuration such that displacement 230b exists between first layer 212 and base structure protrusion 222 when driver 140 transmits a bias voltage to ultrasound transducer 120 and a second piezoelectric voltage to piezoelectric stack 200a-b. While the second piezoelectric voltage is received by piezoelectric stack 200a-b and the bias voltage is received by ultrasound transducer 120, ultrasound transducer 120 may transmit an ultrasound frequency at a second frequency. In addition, when ultrasound transducer 120 is in a second configuration, ultrasound transducer 120 may also receive an ultrasound frequency at the second frequency and relay that signal to receiver 130.

Figure 3A:
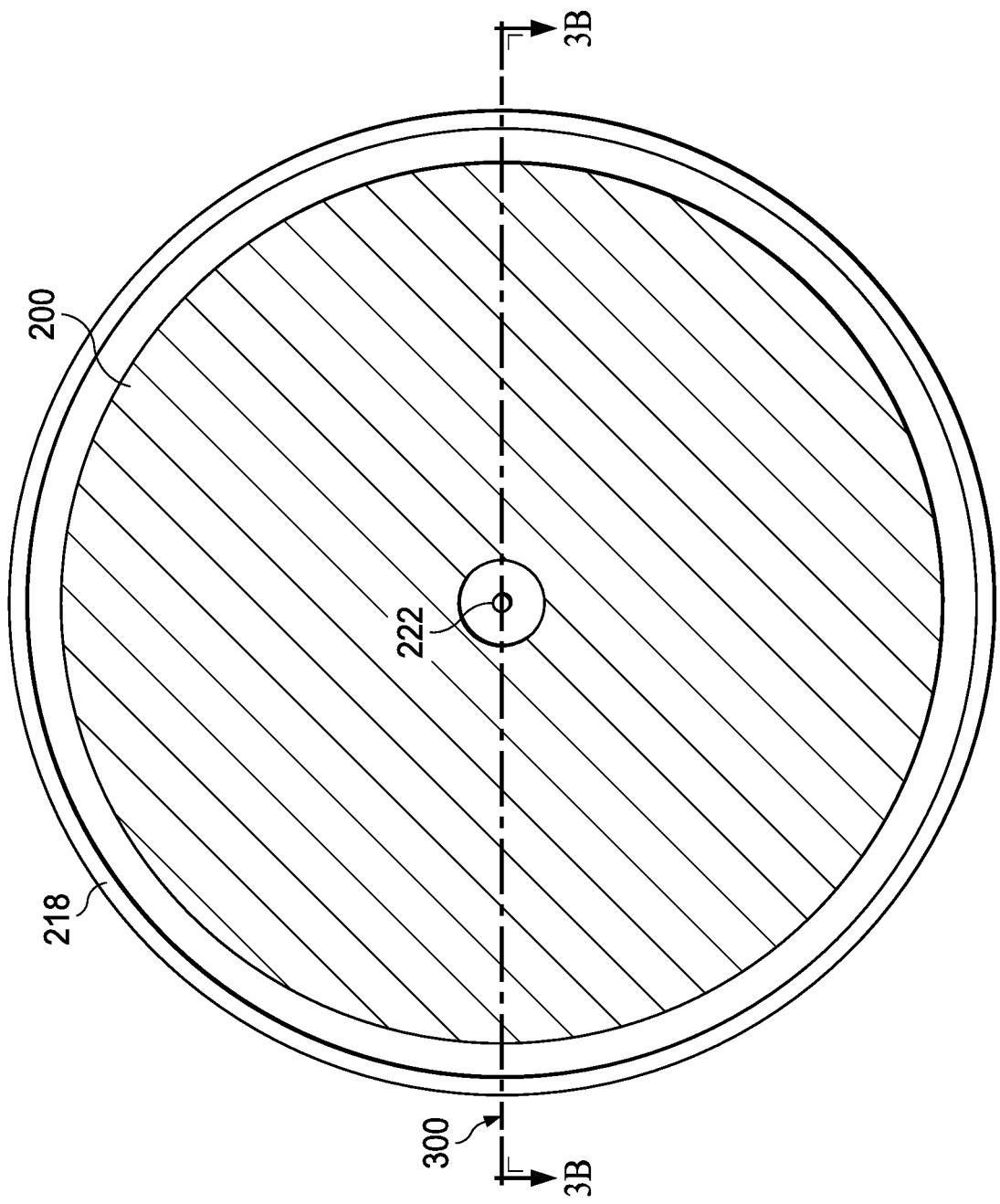
FIGS. 3A-C illustrate an example array of electrodes capable of producing at least two ultrasound signals at separate frequencies.
Figure 3B:
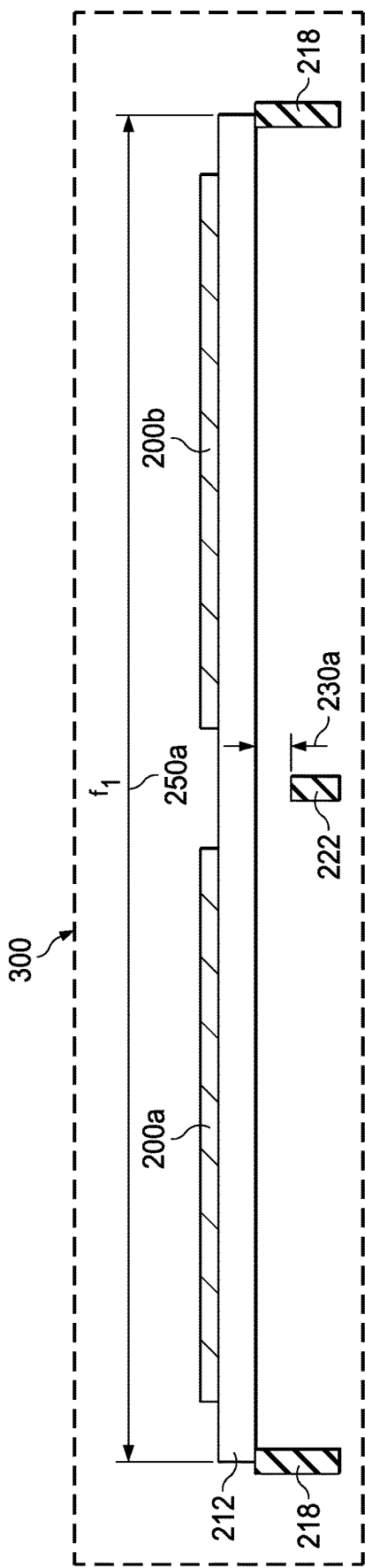
Figure 3C:
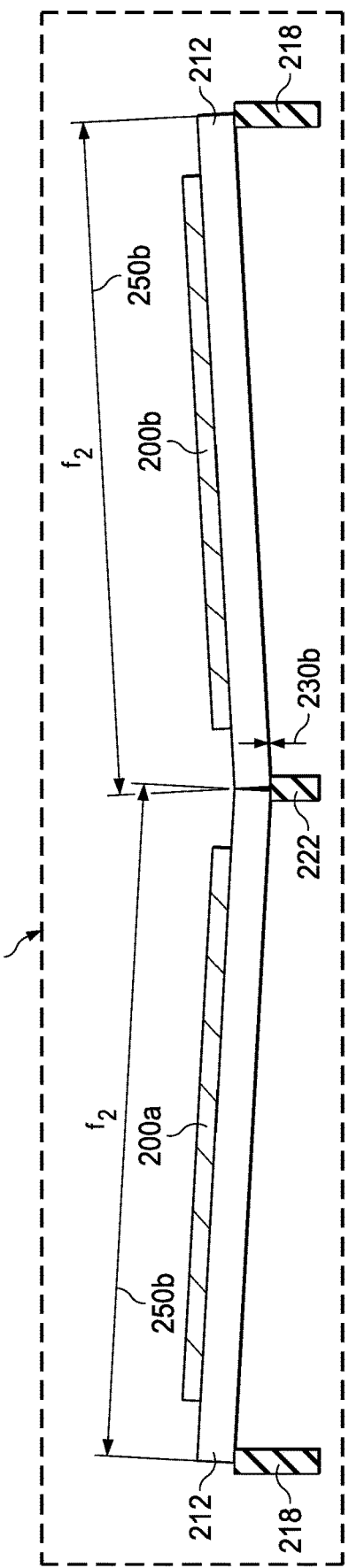

FIG. 3A illustrates a top-down view of ultrasound transducer 120 that is capable of producing at least two ultrasound signals at separate frequencies. Specifically, by changing the shape of the transmitting area in ultrasound transducer 120, ultrasound transducer 120 may transmit and/or receive ultrasound signals at different frequencies. In FIG. 3A, cross-sectional view 300 illustrates the cross-sectional slice of ultrasound transducer 120 that is depicted in FIGS. 3B-C. Moreover, in FIG. 3A, piezoelectric stack 200a-b illustrates the positioning of the piezoelectric stack in relation to base structure protrusion 222 and support structure 218. FIGS. 3B-C, as discussed in further detail below, illustrates ultrasound transducer 120 in various configurations using one footprint to transmit and/or receive ultrasound signals at various frequencies.

FIG. 3B illustrates a cross-sectional view of ultrasound transducer 120 in a first configuration. In certain embodiments, the first configuration of ultrasound transducer 120 occurs because the voltage difference between top plate 214 and base structure 220 is below the bias voltage threshold. As illustrated in FIG. 3B, displacement 230a illustrates a gap that exists between base structure protrusion 222 and first layer 212. Due to the shape of ultrasound transducer 120 when a gap exists between base structure protrusion 222 and first layer 212, first frequency 250a can be emitted from and/or detected by ultrasound transducer 120.

FIG. 3C illustrates a cross-sectional view of ultrasound transducer 120 in a second configuration. In certain embodiments, the second configuration of ultrasound transducer 120 occurs because a voltage difference between top plate 214 and base structure 220 is above a certain bias voltage threshold. In particular, bias voltage may be a voltage applied directly to top plate 214 and/or base structure 220 such that the voltage difference between top plate 214 and base structure 220 is above the bias voltage threshold. As illustrated in FIG. 3C, displacement 230b illustrates a contact between base structure protrusion 222 and first layer 212. Due to the different shape of ultrasound transducer 120 when a gap does not exist between base structure protrusion 222 and first layer 212, second frequency 250b can be emitted from and/or detected by transducer 120. Typically, second frequency 250b is at a higher frequency than first frequency 250a.

Figure 4A:
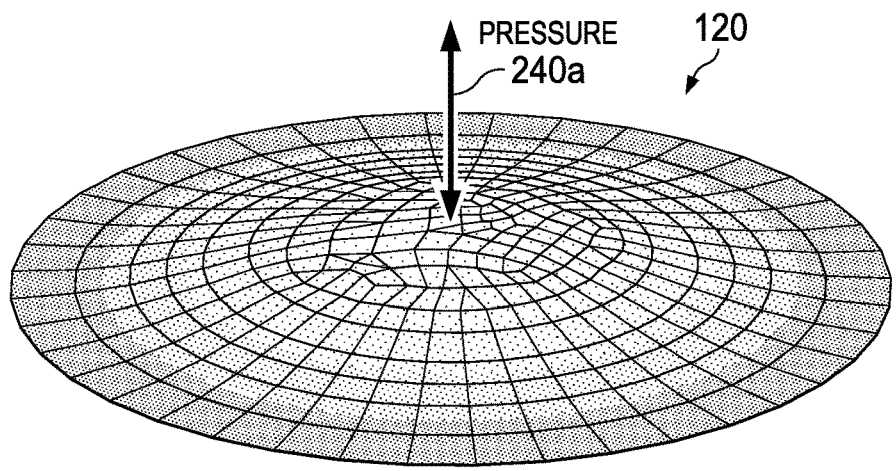
FIGS. 4A-B illustrate pressure contour maps displaying example pressure contours of the dual-frequency transducer.

FIG. 4A illustrates a top-down view of a pressure contour map when ultrasound transducer 120 is in a first configuration. Specifically, the first configuration of ultrasound transducer 120 occurs because the voltage difference between top plate 214 and base structure 220 is below the bias voltage threshold. In other words, displacement 230a is a cavity between base structure protrusion 222 and first layer 212.

In the pressure contour map in FIG. 4A, the focal point for the transmission and reception of an ultrasound signal for ultrasound transducer 120 in the first configuration is in the center of ultrasound transducer 120 at pressure point 240a. Because a cavity exists at displacement 230a, the combination of pressure created by the piezoelectric stack 200a-b and capacitive stack 210 causes ultrasound signals to emit from and to be detected by the center of ultrasound transducer 120.

Figure 4B:
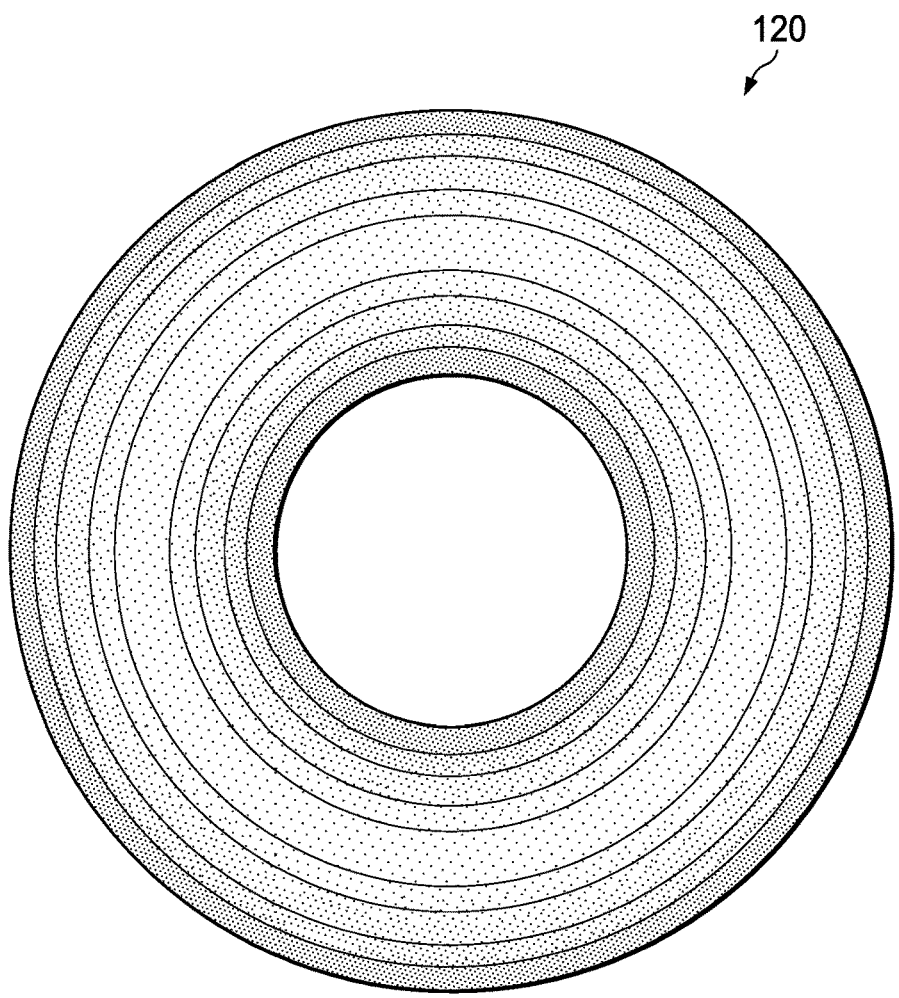

FIG. 4B illustrates a top-down view of a pressure contour map when ultrasound transducer 120 is in a second configuration. Specifically, the second configuration of ultrasound transducer 120 occurs because the voltage difference between top plate 214 and base structure 220 is above the bias voltage threshold. As an example, a bias voltage may be a voltage applied directly to top plate 214 and/or base structure 220 such that the voltage difference between top plate 214 and base structure 220 is above the bias voltage threshold. Accordingly, displacement 230b as a null value occurs as base structure protrusion 222 contacts first layer 212.

In the pressure contour map in FIG. 4B, the focal point of transmission and reception of an ultrasound signal for ultrasound transducer 120 in the second configuration is dispersed above the circular locations of piezoelectric stack 200a-b at pressure points 240b. Because a wall is formed at displacement 230b, the combination of pressure primarily created by piezoelectric stack 200a-b causes ultrasound signals to emit from the circular location of piezoelectric stack 200a-b and not from the inner portion of ultrasound transducer 120 (where displacement 230b exists).

FIG. 5A illustrates a second embodiment of ultrasound transducer 500 in a first configuration. Ultrasound transducer 500 may transmit and/or receive ultrasound signals at three different frequencies. Ultrasound transducer 500 may comprise one or more piezoelectric stack 200a-d and capacitive stack 210. Similar to FIG. 1A, each piezoelectric stack 200a-d may comprise first electrode 202a-d, piezoelectric material 204a-d, and second electrode 206a-d. Capacitive stack 210 may comprise first layer 212 (with first layer 212 comprising top plate 214 and insulation layer 216), support structure 218, and base structures 505a-c. The space between base structure protrusion 507a and first layer 212 may form gap 530a. Moreover, pressure points 540a depict the focal point of transmission and reception of an ultrasound signal at a first frequency for ultrasound transducer 500 in the first configuration.

Unlike the embodiment displayed in FIG. 1A, ultrasound transducer 500 is a box shape. While ultrasound transducer 120 may be in a rectangular shape in a top-down view, ultrasound transducer 120 may be any shape that comprises one or more piezoelectric stack 200a-d and capacitive stack 210. For example, the top-down shape of ultrasound transducer 120 may be a circle or an octagon.

Moreover, unlike the embodiment displayed in FIG. 1A, base structure 505a in ultrasound transducer 500 may comprise base structure protrusion 507a, base structure 505b in ultrasound transducer 500 may comprise base structure protrusion 222b, and base structure 505c in ultrasound transducer 500 may comprise base structure protrusion 222c. Base structure protrusions 507a-c may be a structure that protrudes from base structure 505a-c towards first layer 212. Each base structures 505a-c and base structure protrusions 507a-c may be electrically decoupled by bottom insulation layer 535. Moreover, each base structure protrusion 507a-c may come into contact with first layer 212 based on a voltage difference between the respective base structure 505a-c and first layer 212.

In certain embodiments, base structure protrusion 507a may come into contact with first layer 212 (e.g., insulation layer 216) when the voltage difference between top plate 214 and base structure protrusion 507a is above a first bias voltage threshold. As an example, a first bias voltage may be a DC voltage applied directly to base structure 505a. In certain embodiments, a first bias voltage may cause the voltage difference between top plate 214 and base structure 505a to be above the first bias voltage threshold. The first bias voltage threshold may be set at the voltage at which first layer 212 first comes into contact with base structure protrusion 507a. A bias voltage above first bias voltage threshold may cause first layer 212 to contact base structure protrusion 507a. In other words, first layer 212 may be electrostatically anchored to base structure protrusion 507a when base structure 505a receives a bias voltage above the first bias voltage threshold. However, because base structure 505a is electrically isolated from base structures 505b-c, the bias voltage at base structure 505a does not affect the displacement between base structure protrusion 507b and first layer 212 or the displacement between base structure protrusion 507c and first layer 212.

Similarly, when a voltage difference between top plate 214 and base structure 505b is above a second bias voltage threshold, base structure protrusion 222b may come into contact with first layer 212 (e.g., insulation layer 216). As an example, a second bias voltage may be a DC voltage applied directly to base structure 505b. In certain embodiments, a second bias voltage may cause the voltage difference between top plate 214 and base structure 505b to be above the second bias voltage threshold. In particular embodiments, the second bias voltage threshold may be higher, lower, or equal to the first bias voltage threshold. The second bias voltage threshold may be set at the voltage at which first layer 212 first comes into contact with base structure protrusion 507b. A bias voltage above second bias voltage threshold may cause first layer 212 to contact base structure protrusion 222b. In other words, first layer 212 may be electrostatically anchored to base structure protrusion 507b when base structure 505b receives a bias voltage above the second bias voltage threshold. However, because base structure 222b is electrically isolated from base structures 505a and 505c, the bias voltage at base structure 505b does not affect the displacement between base structure protrusion 507a and first layer 212 or the displacement between base structure protrusion 507c and first layer 212.

Likewise, when a voltage difference between top plate 214 and base structure 505c is above a third bias voltage threshold, base structure protrusion 222c may come into contact with first layer 212 (e.g., insulation layer 216). As an example, a third bias voltage may be a DC voltage applied directly to base structure 505c. In certain embodiments, the third bias voltage may cause the voltage difference between top plate 214 and base structure 505c to be above the third bias voltage threshold. In particular embodiments, the third bias voltage threshold higher, lower, or equal to the first bias voltage threshold and/or second voltage threshold. The third bias voltage threshold may be set at the voltage at which first layer 212 first comes into contact with base structure protrusion 507c. A bias voltage above third bias voltage threshold may cause first layer 212 to contact base structure protrusion 222c. In other words, first layer 212 may be electrostatically anchored to base structure protrusion 222c when base structure 505c receives a bias voltage above the third bias voltage threshold. However, because base structure 505c is electrically isolated from base structures 505a-b, the bias voltage at base structure 505c does not affect the displacement between base structure protrusion 507a and first layer 212 or the displacement between base structure protrusion 507b and first layer 212.

Accordingly, first displacement 510 between base structure protrusion 507a and top plate 216, second displacement 512 between base structure protrusion 507b and top plate 216, and third displacement 514 between base structure protrusion 507c and top plate 216 are configurable by adjusting the bias voltages applied to one or more base structures 505a-c (e.g., the bias voltage received directly by one or more base structures 505a-c).

Gap 530a exists because of the chasm between first layer 212 and base structures 505a-c. By changing the shape of gap 530a for ultrasound transducer 120, ultrasound transducer 120 can transmit and/or receive ultrasound signals at different frequencies. Typically, a larger gap 530 produces a smaller ultrasound frequency (e.g., first frequency 550a).

First displacement 510 is a displacement between base structure protrusion 507a and first layer 212 (e.g., insulation layer 216). As depicted in FIG. 5A, first displacement 510 exists between base structure protrusion 507a and first layer 212. First layer 212 (e.g., insulation layer 216) may come into contact with base structure protrusion 507a when a voltage difference between first layer 212 and base structure 505a is above a first bias voltage threshold. However, as depicted in FIG. 5A, the voltage difference between first layer 212 and base structure 505a is not above the first bias voltage threshold. Accordingly, first displacement 510 exists as a cavity between base structure protrusion 507a and first layer 212.

Similarly, second displacement 512 is a displacement between base structure protrusion 507b and first layer 212 (e.g., insulation layer 216). As depicted in FIG. 5A, second displacement 512 exists between base structure protrusion 507b and first layer 212. First layer 212 (e.g., insulation layer 216) may come into contact with base structure protrusion 507b when a voltage difference between first layer 212 and base structure 505b is above a second bias voltage threshold. However, as depicted in FIG. 5A, the voltage difference between first layer 212 and base structure 505b is not above the second bias voltage threshold. Accordingly, second displacement 512 exists as a cavity between base structure protrusion 507b and first layer 212.

Likewise, third displacement 514 is a displacement between base structure protrusion 507c and first layer 212 (e.g., insulation layer 216). As depicted in FIG. 5A, third displacement 514 exists between base structure protrusion 507c and first layer 212. First layer 212 (e.g., insulation layer 216) may come into contact with base structure protrusion 507c when a voltage difference between first layer 212 and base structure 505c is above a third bias voltage threshold. However, as depicted in FIG. 5A, the voltage difference between first layer 212 and base structure 505c is not above the third bias voltage threshold. Accordingly, third displacement 514 exists as a cavity between base structure protrusion 507c and first layer 212.

Pressure points 540a depict the focal point of transmission and reception of an ultrasound signal at a first frequency for ultrasound transducer 500 in the first configuration. Because cavities exists at first displacement 510, second displacement 512, and third displacement 514, the combination of pressure created by the piezoelectric stack 200a-d and capacitive stack 210 causes ultrasound signals to emit from pressure points 540a and to be detected at pressure points 540a.

FIG. 5B illustrates a cross-sectional view of ultrasound transducer 500 in a second configuration. Ultrasound transducer 500 in FIG. 5B is similar in structure to ultrasound transducer 500 in FIG. 5A except first layer 212 is in contact with base structure protrusion 507b. Second displacement 512 in FIG. 5B is the lack of space between base structure protrusion 507b and first layer 212. In certain embodiments, second displacement 512 may be a non-zero value such that base structure protrusion 507b and first layer 212 are separate. First displacement 510 in FIG. 5B is the displacement between base structure protrusion 507a and first layer 212, and third displacement 514 in FIG. 5B is the displacement between base structure protrusion 507c and first layer 212. Portions that are not base structure protrusion 507b (e.g., base structure protrusion 507a and 507c), however, may not be in contact with first layer 212 and may form multiple gaps 530b. Moreover, pressure points 540b depict the focal point of transmission and reception of an ultrasound signal at a second frequency for ultrasound transducer 500 in the second configuration. In certain embodiments, the second configuration of ultrasound transducer 500 occurs because: (a) a voltage difference between top plate 214 and base structure 505a is below a first bias voltage threshold; (b) a voltage difference between top plate 214 and base structure 505c is above a second bias voltage threshold; and (c) a voltage difference between top plate 214 and base structure 505c is below a third bias voltage threshold. In certain embodiments, a bias voltage may be a voltage applied directly to base structure 505b such that the voltage difference between top plate 214 and base structure 505b is above a second bias voltage threshold.

In certain embodiments and as illustrated, first layer 212 may come into contact with base structure protrusion 507b when a voltage difference between top plate 214 and base structure 505b is above a second bias voltage threshold. For example, the second bias voltage threshold may be set at the voltage at which first layer 212 first comes into contact with base structure protrusion 507b. In particular embodiments, bias voltage may be a voltage applied directly to base structure 505b. In addition, bias voltage may be applied as a DC voltage. However, when the voltage difference between top plate 214 and base structure 505a is below a first voltage threshold and the voltage difference between top plate 214 and base structure 505c is below a third voltage threshold, base structure protrusion 507a and base structure protrusion 507c may not be in contact with first layer 212 in certain embodiments.

Gaps 530b exist because of the wall that exists since first layer 212 and base structure protrusion 507b are in contact with each other. By changing the shape of gaps 530b for ultrasound transducer 120, ultrasound transducer 120 can transmit and/or receive ultrasound signals at different frequencies (e.g., second frequency 550b).

In addition, second displacement 512 is a displacement between base structure protrusion 507b and first layer 212 (e.g., insulation layer 216) in a second configuration. As depicted in FIG. 5B, second displacement 512 illustrates the lack of space between base structure protrusion 507b and first layer 212. First layer 212 (e.g., insulation layer 216) may come into contact with base structure protrusion 507b when a voltage difference between top plate 214 and base structure 505b is above a second bias voltage threshold. As depicted in FIG. 5B, the voltage difference between first layer 212 and base structure 220 is above the second bias voltage threshold. In particular, bias voltage in FIG. 5B may be a voltage applied directly to base structure 505b such that the voltage difference between top plate 214 and base structure 505b is above the second bias voltage threshold. Accordingly, base structure protrusion 507b is in contact with first layer 212.

In addition, first displacement 510 is a displacement between base structure protrusion 507a and first layer 212, and third displacement 514 is a displacement between base structure protrusion 507c and first layer 212. As depicted in FIG. 5B, first displacement 510 exists as a cavity between base structure protrusion 507a and first layer 212. Similarly, as depicted in FIG. 5B, third displacement 514 also exists as a cavity between base structure protrusion 507c and first layer 212. Moreover, as depicted in FIG. 5B, the voltage difference between top plate 214 and base structure 505a is below a first bias voltage threshold, and the voltage difference between top plate 214 and base structure 505a is below a third bias voltage threshold. Accordingly, first displacement 510 exists as a cavity between base structure protrusion 507a and first layer 212, and second displacement 514 exists as a cavity between base structure protrusion 507c and first layer 212.

In certain embodiments, second configuration occurs because: (a) a voltage difference between top plate 214 and base structure 505a is below a first bias voltage threshold; (b) a voltage difference between top plate 214 and base structure 505c is above a second bias voltage threshold; and (c) a voltage difference between top plate 214 and base structure 505c is below a third bias voltage threshold. With base structure 505b being the only base structure 220 to receive a bias voltage above a threshold, base structure protrusion 507b is in contact with first layer 212 whereas base structure protrusion 507a and base structure protrusion 507c are not in contact with first layer 212.

Pressure points 540b depict the focal point of transmission and reception of an ultrasound signal at a second frequency for ultrasound transducer 500 in the second configuration. Because a wall is formed at second displacement 512, the pressure primarily created by the piezoelectric stack 200a-d cause ultrasound signals to emit from pressure points 540b and to be detected at pressure points 540b.

Notably, even if second displacement 512 does not cause base structure protrusion 507b to come into contact with first layer 212, the pressure points in FIG. 5B may be different than the pressure points in FIG. 5A so long as gap(s) 530 are altered. By changing the shape of the transmitting area (e.g., gap(s) 530) for ultrasound transducer 500, capacitive stack 210 can change the frequency of the ultrasound signal based on the displacement between the base structure protrusions 507a-c and first layer 212.

Figure 5C:
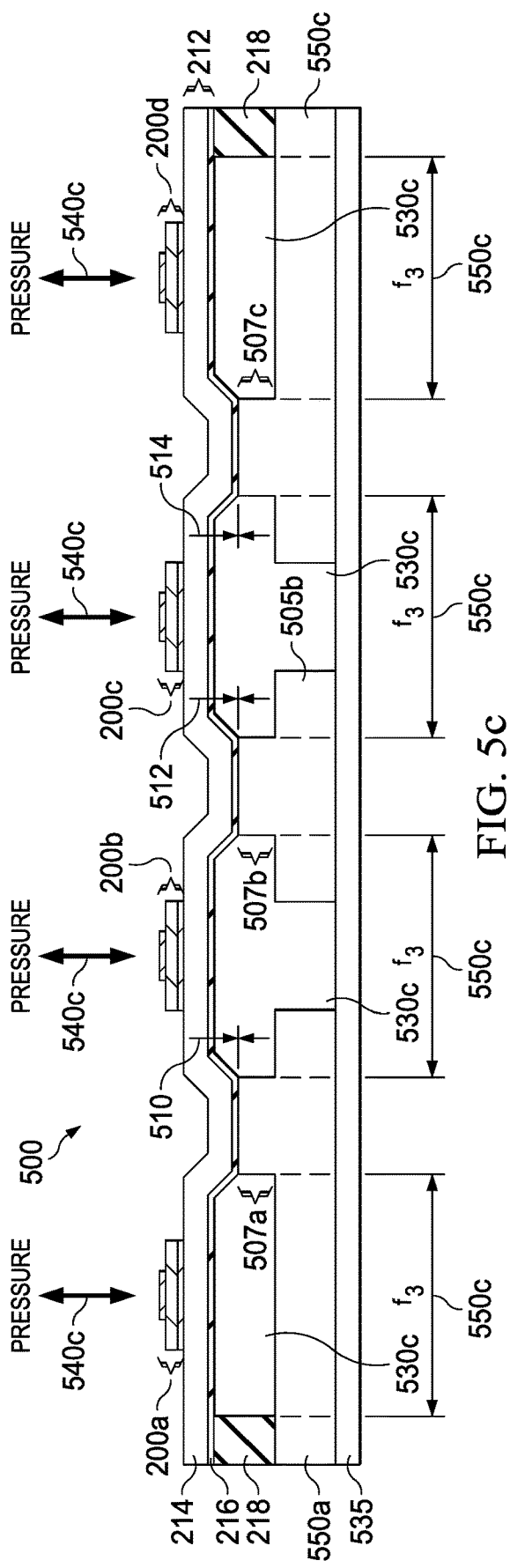

FIG. 5C illustrates a cross-sectional view of ultrasound transducer 500 in a third configuration. Ultrasound transducer 500 in FIG. 5C is similar in structure to ultrasound transducer 500 in FIG. 5A and ultrasound transducer 500 in FIG. 5B except first layer 212 is in contact with base structure protrusion 507a-c. First displacement 510 in FIG. 5C is the lack of space between base structure protrusion 507a and first layer 212, second displacement 512 in FIG.

5C is the lack of space between base structure protrusion 507b and first layer 212, and third displacement 514 in FIG. 5C is the lack of space between base structure protrusion 507c and first layer 212. In certain embodiments, first displacement 510, second displacement 512, and/or third displacement 514 may be a non-zero value. Portions that are not base structure protrusion 507a-c, however, may not be in contact with first layer 212 and may form multiple gaps 530c. Moreover, pressure points 540c depict the focal point of transmission and reception of an ultrasound signal at a third frequency for ultrasound transducer 500 in the third configuration. In certain embodiments, the third configuration of ultrasound transducer 500 occurs because: (a) a voltage difference between top plate 214 and base structure 505a is above a first bias voltage threshold; (b) a voltage difference between top plate 214 and base structure 505c is above a second bias voltage threshold; and (c) a voltage difference between top plate 214 and base structure 505c is above a third bias voltage threshold.

In certain embodiments and as illustrated, first layer 212 may come into contact with base structure protrusion 507a-c when a voltage difference between top plate 214 and base structure 505a-c is above a certain voltage threshold. For example, the first bias voltage threshold may be set at the voltage at which first layer 212 first comes into contact with base structure protrusion 507a, the second bias voltage threshold may be set at the voltage at which first layer 212 first comes into contact with base structure protrusion 507b, and the third bias voltage threshold may be set at the voltage at which first layer 212 first comes into contact with base structure protrusion 507c.

Gaps 530c exist because of the walls that exist since first layer 212 and base structure protrusion 507a-c are in contact with each other. By changing the shape of gaps 530c for ultrasound transducer 120, ultrasound transducer 120 can transmit and/or receive ultrasound signals at different frequencies (e.g., third frequency 550c).

In addition, first displacement 510 is a displacement between base structure protrusion 507a and first layer 212 (e.g., insulation layer 216) in a third configuration. As depicted in FIG. 5C, first displacement 510 illustrates the lack of space between base structure protrusion 507a and first layer 212. First layer 212 (e.g., insulation layer 216) may come into contact with base structure protrusion 507a when a voltage difference between top plate 214 and base structure 505a is above a first bias voltage threshold. As depicted in FIG. 5C, the voltage difference between top plate 214 and base structure 505a is above a first bias voltage threshold. In certain embodiments, base structure 505a receives a bias voltage that is greater than the first bias voltage threshold. Accordingly, base structure protrusion 507a is in contact with first layer 212.

Likewise, second displacement 512 is a displacement between base structure protrusion 507b and first layer 212 (e.g., insulation layer 216) in a third configuration. As depicted in FIG. 5C, second displacement 512 illustrates the lack of space between base structure protrusion 507b and first layer 212. First layer 212 (e.g., insulation layer 216) may come into contact with base structure protrusion 507b when a voltage difference between top plate 214 and base structure 505b is above a second bias voltage threshold. As depicted in FIG. 5C, the voltage difference between top plate 214 and base structure 505b is above a second bias voltage threshold. In certain embodiments, base structure 505b receives a bias voltage that is greater than the second bias voltage threshold. Accordingly, base structure protrusion 507b s in contact with first layer 212.

Similarly, third displacement 514 is a displacement between base structure protrusion 507c and first layer 212 (e.g., insulation layer 216) in a third configuration. As depicted in FIG. 5C, third displacement 514 illustrates the lack of space between base structure protrusion 507c and first layer 212. First layer 212 (e.g., insulation layer 216) may come into contact with base structure protrusion 507c when a voltage difference between top plate 214 and base structure 505c is above a third bias voltage threshold. As depicted in FIG. 5C, the voltage difference between top plate 214 and base structure 505c is above a third bias voltage threshold. In certain embodiments, base structure 505c receives a bias voltage that is greater than the third bias voltage threshold. Accordingly, base structure protrusion 507c is in contact with first layer 212.

Pressure points 540c depict the focal point of transmission and reception of an ultrasound signal at a third frequency for ultrasound transducer 500 in the third configuration. Because walls are formed at first displacement 510 and second displacement 520a-b, the pressure primarily created by the piezoelectric stack 200a-d causes ultrasound signals to emit from pressure points 540c and to be detected at pressure points 540c.

Notably, the pressure points in FIG. 5C may be different than the pressure points in FIG. 5A and FIG. 5C so long as gap(s) 530 are altered. By changing the shape of the transmitting area (e.g., gap(s) 530) for ultrasound transducer 500, capacitive stack 210 can change the frequency of the ultrasound signal based on the displacement between the base structure protrusion 507a-c and first layer 212.

In an exemplary embodiment, ultrasound transducer 500 comprises piezoelectric stack 200a-d with each piezoelectric stack 200a-d comprising first electrode 202a-d, second electrode 206a-d, and piezoelectric material 204a-d between first electrode 202a-d and second electrode 206a-d. In addition, ultrasound transducer 500 may also comprise first layer 212 (which may comprise of top plate 214 and insulation layer 216) with first layer 212 being in contact with piezoelectric stack 200a-d. Moreover, ultrasound transducer 500 may further comprise base structure 220 that is beneath first layer 212. In specific embodiments, base structure 220 supports first layer 212 through support structure 218.

A configurable displacement occurs between base structure protrusion 507a-c and first layer 212. For example, first displacement 510 may exist as a gap when a bias voltage between first layer 212 and base structure 505a is below a first bias voltage threshold. Similarly, second displacement 512 may exist as a gap when a bias voltage between first layer 212 and base structure 505b is below a second bias voltage threshold. Likewise, third displacement 514 may exist as a gap when a bias voltage between first layer 212 and base structure 505c is below a third bias voltage threshold.

Moreover, in certain embodiments, first displacement 510 may be null when a bias voltage between first layer 212 and base structure 505a is larger than a first bias voltage threshold, causing first layer 212 (and, in particular, insulation layer 216 of first layer 212) to contact base structure protrusion 507a of base structure 505a. Similarly, in certain embodiments, second displacement 512 may be null when a bias voltage between first layer 212 and base structure 505b is larger than a second bias voltage threshold, causing first layer 212 (and, in particular, insulation layer 216 of first layer 212) to contact base structure protrusion 507b of base structure 505b. Likewise, in certain embodiments, third displacement 514 may be null when a bias voltage between first layer 212 and base structure 505c is larger than a third bias voltage threshold, causing first layer 212 (and, in particular, insulation layer 216 of first layer 212) to contact base structure protrusion 507c of base structure 505c. In certain embodiments, the bias voltage may be applied to base structures 505a-c. Multiple gaps 530 may exist as one of more second portions of base structure 220 (e.g., not base structure protrusion 507a-c) do not come into contact with first layer 212.

In addition, as ultrasound transducer 500 is in a first configuration such that base structure protrusion 507a-c are not in contact with first layer 512, driver 140 may transmit a first piezoelectric voltage to piezoelectric stack 200a-d and/or capacitive stack 210. While the first Piezoelectric voltage is received by ultrasound transducer 500, piezoelectric stack 200a-d and/or capacitive stack 210 may transmit an ultrasound frequency at a first frequency. In addition, when ultrasound transducer 500 is in a first configuration, ultrasound transducer 500 may also receive an ultrasound frequency at the first frequency and relay that signal to receiver 130.

Moreover, as ultrasound transducer 500 is in a second configuration such that base structure protrusion 507b is in contact with first layer 212 but base structure protrusion 507a and 222c are not in contact with first layer 212, driver 140 may transmit a first bias voltage to base structure 222b and also a second Piezoelectric voltage to piezoelectric stack 200a-d. While the second Piezoelectric voltage is received by piezoelectric stack 200a-d and the first bias voltage is received by ultrasound transducer 500, ultrasound transducer 500 may transmit an ultrasound frequency at a second frequency. In addition, when ultrasound transducer 500 is in a second configuration, ultrasound transducer 500 may also receive an ultrasound frequency at the second frequency and relay that signal to receiver 130.

As ultrasound transducer 500 is in a third configuration such that base structure protrusion 507a-c is in contact with first layer 212, driver 140 may transmit a second bias voltage to base structures 505a-c and also a third Piezoelectric voltage to piezoelectric stack 200a-d. While the third Piezoelectric voltage is received by piezoelectric stack 200a-d and the second bias voltage is received by base structures 505a-c, ultrasound transducer 500 may transmit an ultrasound frequency at a third frequency. In addition, when ultrasound transducer 500 is in a third configuration, ultrasound transducer 500 may also receive an ultrasound frequency at the third frequency and relay that signal to receiver 130.

While illustrated as comprising three base structure protrusions 522a-c, ultrasound transducer 500 may comprise any number of base structure protrusions (e.g., three or more base structure protrusions). As different bias voltages are applied to each base structure 220, a unique combination of base structure protrusions may come into contact with first layer 212. For example, a voltage above a first bias voltage threshold may or may not be applied to base structure 505a, a voltage above a second bias voltage threshold may or may not be applied to base structure 505b, and/or a voltage above a first bias voltage threshold may or may not be applied to base structure 505c. Accordingly, gap(s) 530 may be altered. By changing the shape of transmitting area (e.g., gap(s) 530) for ultrasound transducer 500, ultrasound transducer 500 can transmit and/or receive ultrasound signals at a multitude of frequencies.

Figure 6A:
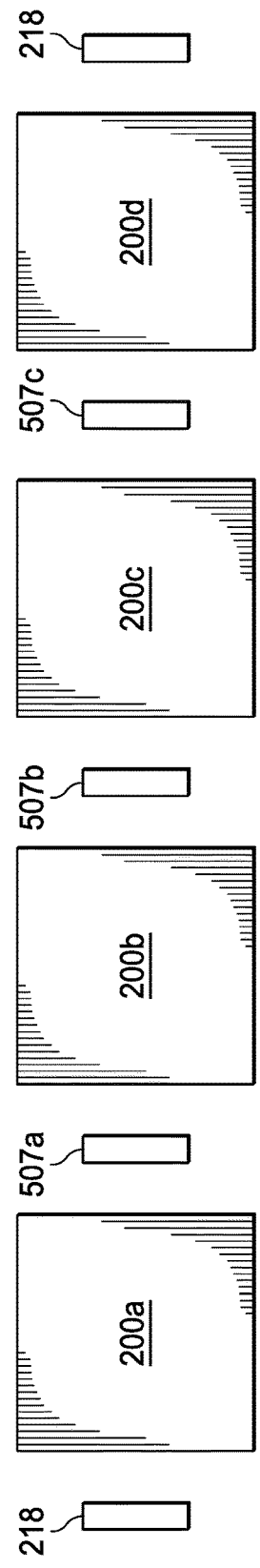

FIG. 6A illustrates a top-down view of ultrasound transducer 500 capable of producing at least three ultrasound signals at separate frequencies. Specifically, by changing the shape of the transmitting area in ultrasound transducer 500, ultrasound transducer 500 may transmit and/or receive ultrasound signals at different frequencies. In FIG. 6A, piezoelectric stack 200a-d illustrates the positioning of the piezoelectric stacks in relation to base structure protrusion 507a-c and support structure 218. FIGS. 6B-D, as discussed in further detail below, illustrates ultrasound transducer 500 in various configurations using one footprint to transmit and/or receive ultrasound signals at various frequencies.

FIG. 6B illustrates a cross-sectional view of ultrasound transducer 500 in a first configuration. In certain embodiments, the first configuration of ultrasound transducer 500 occurs because: (a) a voltage difference between top plate 214 and base structure 505a is below a first bias voltage threshold; (b) a voltage difference between top plate 214 and base structure 505b is below a second bias voltage threshold; and (c) a voltage difference between top plate 214 and base structure 505c is below a third bias voltage threshold.

As illustrated in FIG. 6B, first displacement 510 illustrates a gap that exists between base structure protrusion 507a and first layer 212, second displacement 512 illustrates a gap that exists between base structure protrusion 507b and first layer 212, and third displacement 514 illustrates a gap that exists between base structure protrusion 507c and first layer 212. Due to the shape of ultrasound transducer 500 when a gap exists between base structure protrusion 507a-c and first layer 212, first frequency 550a can be emitted from and/or detected by ultrasound transducer 500.

FIG. 6C illustrates a cross-sectional view of ultrasound transducer 500 in a second configuration. In certain embodiments, the second configuration of ultrasound transducer 500 occurs because: (a) a voltage difference between top plate 214 and base structure 505a is below a first bias voltage threshold; (b) a voltage difference between top plate 214 and base structure 505b is above a second bias voltage threshold; and (c) a voltage difference between top plate 214 and base structure 505c is below a third bias voltage threshold.

As illustrated in FIG. 6C, second displacement 512 illustrates a contact between base structure protrusion 507b and first layer 212. However, first displacement 510 illustrates a gap that exists between base structure protrusion 507a and first layer 212, and third displacement 514 illustrates a gap that exists between base structure protrusion 507c and first layer 212. Due to the different shape of ultrasound transducer 500 when a gap does not exist between base structure protrusion 507b and first layer 212 but a gap exists between base structure protrusion 507a, base structure protrusion 507b, and first layer 212, second frequency 550b can be emitted from and/or detected by ultrasound transducer 500. Typically, second frequency 550b is at a higher frequency than first frequency 550a.

FIG. 6D illustrates a cross-sectional view of ultrasound transducer 500 in a third configuration. In certain embodiments, the third configuration of ultrasound transducer 500 occurs because: (a) a voltage difference between top plate 214 and base structure 505a is above a first bias voltage threshold; (b) a voltage difference between top plate 214 and base structure 505b is above a second bias voltage threshold; and (c) a voltage difference between top plate 214 and base structure 505c is above a third bias voltage threshold.

As illustrated in FIG. 6D, first displacement 510 illustrates a contact between base structure protrusion 507a and first layer 212, second displacement 512 illustrates a contact between base structure protrusion 507b and first layer 212, and third displacement 514 illustrates a contact between base structure protrusion 507c and first layer 212. Due to the different shape of ultrasound transducer 500 when a gap does not exist between base structure protrusion 507a-c and first layer 212, third frequency 550c can be emitted from and/or detected by ultrasound transducer 500. Typically, third frequency 550c is at a higher frequency than both first frequency 550a and second frequency 550b.

Figure 7:
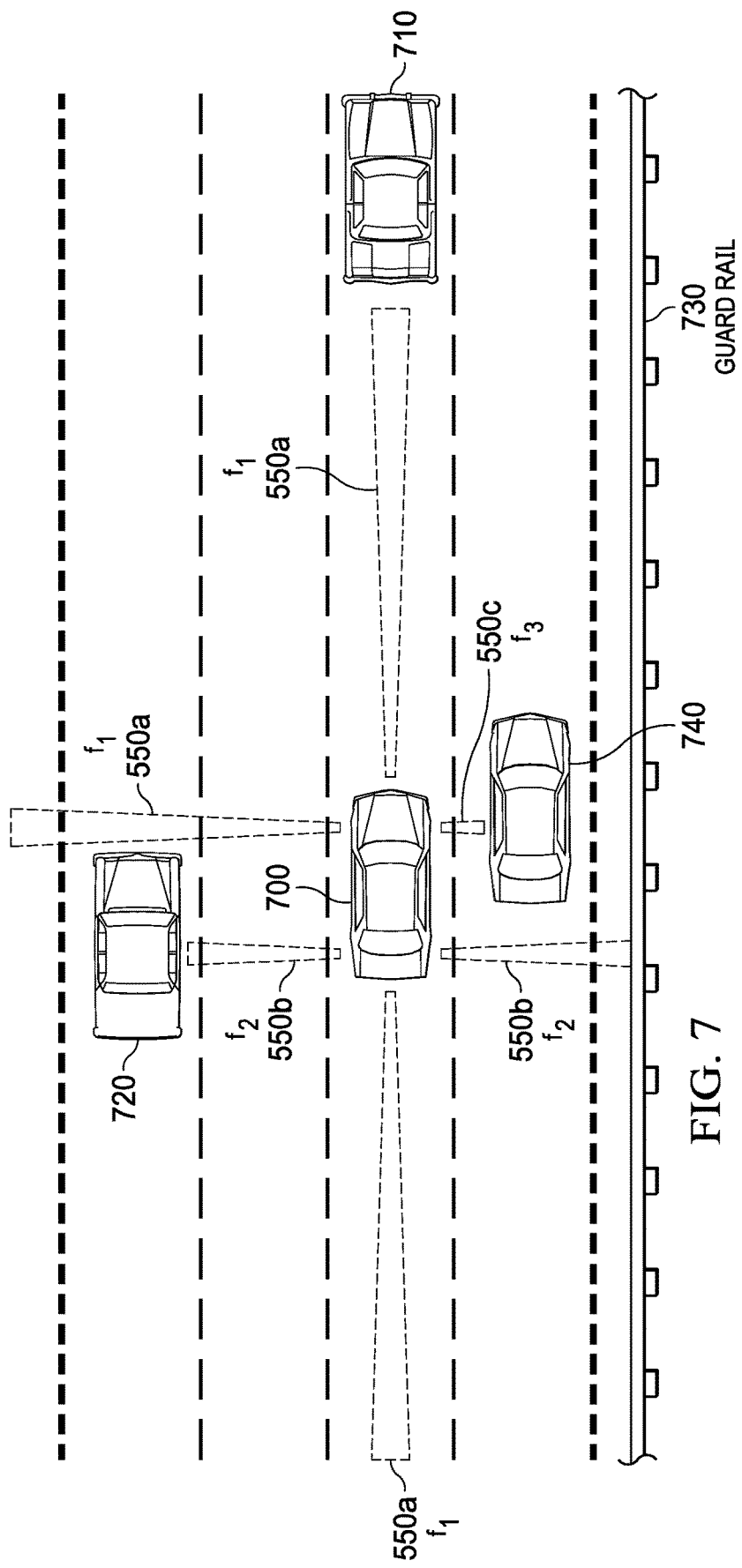
FIG. 7 illustrates an exemplary application of an ultrasound transducer to detect objects at various ranges.

FIG. 7 illustrates an exemplary application of ultrasound transducer 500 to detect objects at various ranges. In particular, FIG. 7 is an example embodiment of a distance measurement system in primary vehicle 700. Primary vehicle 700 is one of many different applications for which ultrasound transducer 500 is suitable. Other applications for which the ultrasound transducer 500 is suitable include structural inspection systems, echolocation systems, gas flow measurement systems, liquid level systems, drone applications, and other applications in which a compact and efficient multi-frequency ultrasound transducer is desirable. In addition, having multiple frequencies may allow for systems, such as primary vehicle 700 to have a higher resolution in the application of ultrasound transducer 500. For example, using various frequencies emitted and detected by ultrasound transducer 500, primary vehicle 700 may detect first vehicle 710, second vehicle 720, guard rail 730, and third vehicle 740. Ultrasound sensor 110 may use amplitude and phase information from reflected acoustic waves to provide structural and functional information about an object of interest. Moreover, particular frequencies may be more useful in detecting certain types of objects as compared to other frequencies. For example, lower frequencies (e.g., first frequency 550a) may be more advantageous for correctly detecting objects a long distance away, whereas higher frequencies (e.g., third frequency 550c) may be more advantageous for correctly detecting objects that are a closer distance away. Moreover, different frequencies may be more advantageous in certain mediums. For example, a higher frequency is advantageous for a liquid medium, whereas a lower frequency is advantageous for an air medium.

Ultrasound transducer 500 (not illustrated) in primary vehicle 700 may be in a first configuration and may transmit an ultrasound signal at first frequency 550a (e.g., 40 kHz). Ultrasound transducer 500 may receive a reflection of the ultrasound signal at first frequency 550a as it bounces off first vehicle 710. Based on a time-of-flight between ultrasound transducer 500 transmitting the ultrasound signal at first frequency 550a and receiving a reflection of the ultrasound signal at first frequency 550a, primary vehicle 700 may be able to detect a presence and estimate a distance of first vehicle 710 from primary vehicle 700.

Moreover, ultrasound transducer 500 in primary vehicle 700 may be in a second configuration and may transmit an ultrasound signal at second frequency 550b (e.g., 80 kHz). Ultrasound transducer 500 may receive a reflection of the ultrasound signal at second frequency 550b as it bounces off second vehicle 720. Based on a time-of-flight between ultrasound transducer 500 transmitting the ultrasound signal at second frequency 550b and receiving a reflection of the ultrasound signal at second frequency 550b, primary vehicle 700 may be able to detect a presence and estimate a distance of second vehicle 720 from primary vehicle 700.

In addition, ultrasound transducer 500 in a second configuration may receive a reflection of the ultrasound signal at second frequency 550b as it bounces off guard rail 730. Based on a time-of-flight between ultrasound transducer 500 transmitting the ultrasound signal at second frequency 550b and receiving a reflection of the ultrasound signal at second frequency 550b, primary vehicle 700 may be able to detect a presence and estimate a distance of guard rail 730 from primary vehicle 700.

Ultrasound transducer 500 in primary vehicle 700 may also be in a third configuration and may transmit an ultrasound signal at third frequency 550c (e.g., 160 kHz). Ultrasound transducer 500 may receive a reflection of the ultrasound signal at third frequency 550c as it bounces off third vehicle 740. Based on a time-of-flight between ultrasound transducer 500 transmitting the ultrasound signal at third frequency 550c and receiving a reflection of the ultrasound signal at third frequency 550c, primary vehicle 700 may be able to detect a presence and estimate a distance of third vehicle 740 from primary vehicle 700.

While FIG. 7 illustrates ultrasound transducer 500 in primary vehicle 700 detecting vehicles and a guard rail, ultrasound transducer 500 may detect any object using any variety of frequencies available in various configurations.

Figure 8:
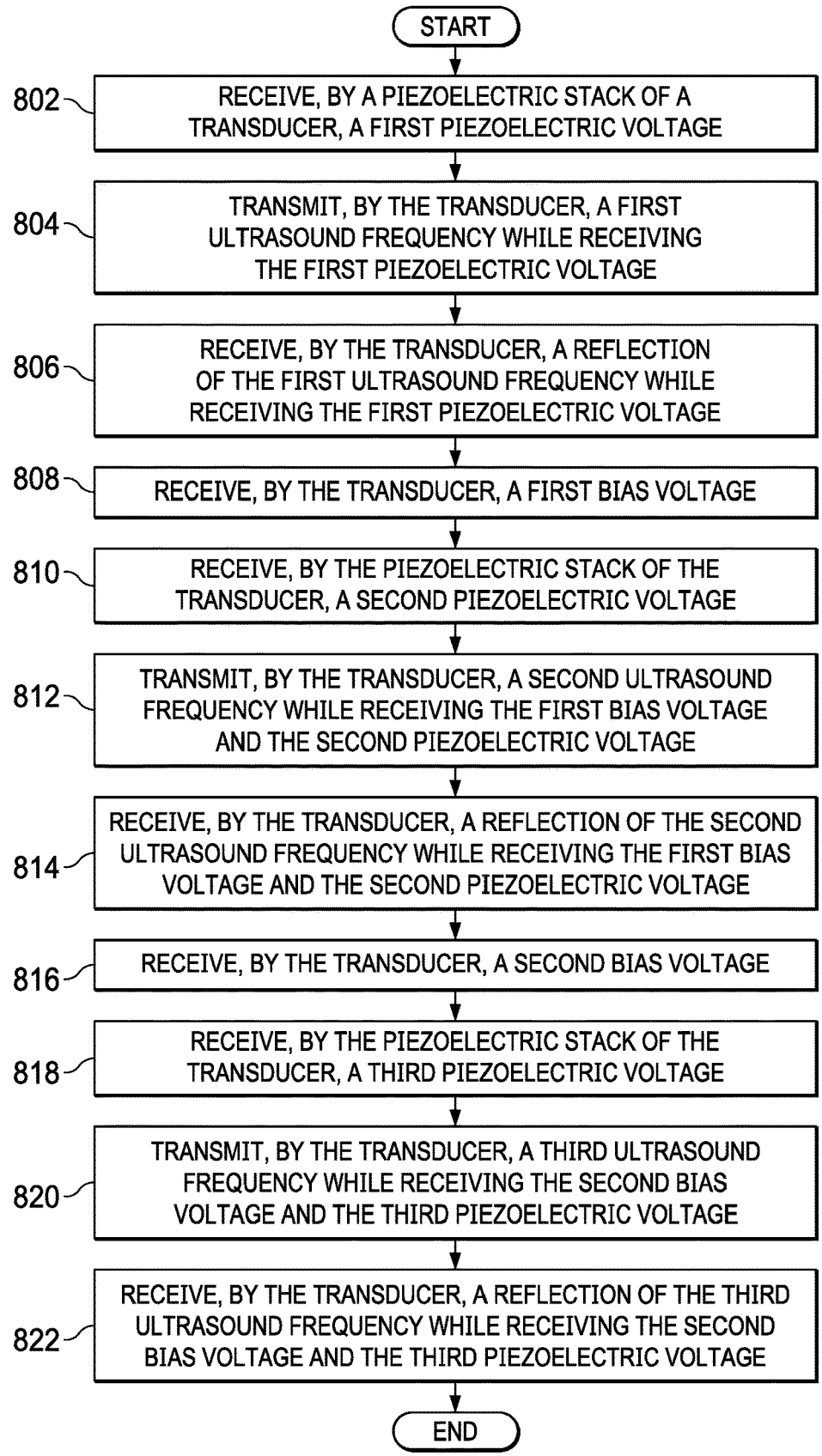
FIG. 8 illustrates an exemplary method to transmit and receive multiple ultrasound signals at different frequencies using an ultrasound transducer.

FIG. 8 illustrates an exemplary method to transmit and receive multiple ultrasound signals at different frequencies using ultrasound transducer 500.

At step 802, piezoelectric stack 200 of ultrasound transducer 500 receives a first piezoelectric voltage.

At step 804, ultrasound transducer 500 transmits a first ultrasound frequency at a first frequency while piezoelectric stack 200 receives the first piezoelectric voltage.

At step 806, ultrasound transducer 500 receives a reflection of the first ultrasound frequency while piezoelectric stack 200 receives the first piezoelectric voltage.

At step 808, ultrasound transducer 500 receives a first bias voltage.

At step 810, piezoelectric stack 200 of ultrasound transducer 500 receives a second piezoelectric voltage.

At step 812, ultrasound transducer 500 transmits a second ultrasound frequency at a second frequency while ultrasound transducer 500 receives the first bias voltage and piezoelectric stack 200 receives the second piezoelectric voltage.

At step 814, ultrasound transducer 500 receives a reflection of the second ultrasound frequency while ultrasound transducer 500 receives the first bias voltage and piezoelectric stack 200 receives the second piezoelectric voltage.

At step 816, ultrasound transducer 500 receives a second bias voltage.

At step 818, piezoelectric stack 200 of ultrasound transducer 500 receives a third piezoelectric voltage.

At step 820, ultrasound transducer 500 transmits a third ultrasound frequency at a third frequency while ultrasound transducer 500 receives the second bias voltage and piezoelectric stack 200 receives the third piezoelectric voltage.

At step 822, ultrasound transducer 500 receives a reflection of the third ultrasound frequency while ultrasound transducer 500 receives the second bias voltage and piezoelectric stack 200 receives the third piezoelectric voltage.

Figure 9:
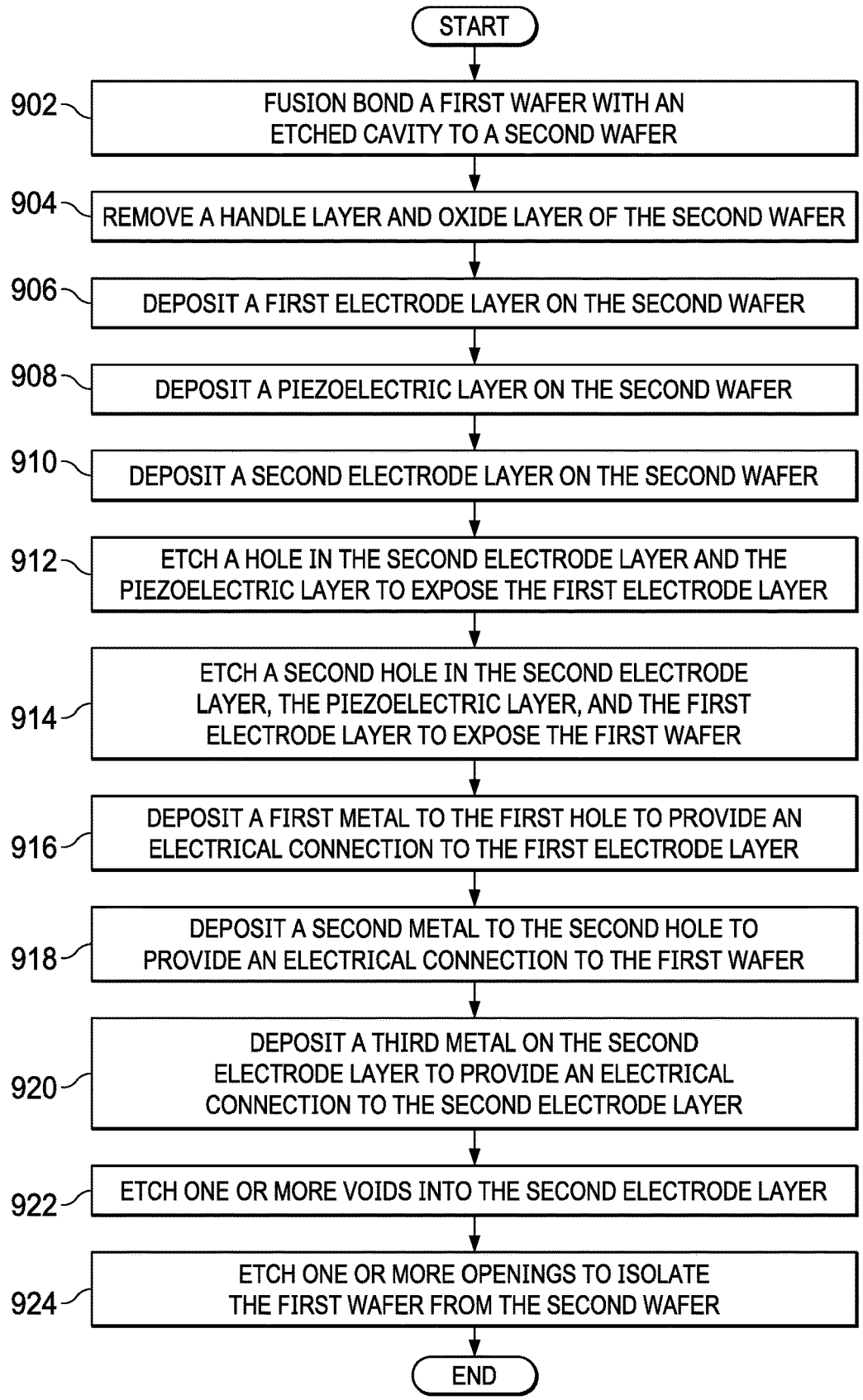
FIG. 9 illustrates an exemplary method for fabricating an ultrasound transducer.

FIG. 9 illustrates an exemplary method for fabricating ultrasound transducer 120. Some embodiments of the ultrasound transducer 120 are produced using different fabrication operations than those detailed in FIG. 9. Though depicted sequentially as a matter of convenience, the actions shown in FIG. 9 can be performed in a different order and/or performed in parallel. Additionally, some implementations may perform only some of the actions shown. While the method illustrates fabricating a single ultrasound transducer, in practice any number of ultrasound transducers may be simultaneously fabricated to produce a plurality of ultrasound transducers on a die for use in one or more ultrasound sensors 110.

At step 902, gap 224 of ultrasound transducer 120 is formed by fusion bonding a first wafer with a second wafer. In particular, a first wafer may have a dual cavity etched to form base structure protrusion 222. The fusion bonding of first wafer that has an etched dual cavity with second wafer forms gap 224 in ultrasound transducer 120. Fusion bonding is the joining together of silicon wafers and silicon-on-insulator wafers without the use of intermediate adhesives. In certain embodiments, first wafer 1002 and/or second wafer 1004 is a silicon-on-insulator wafer. Accordingly, first wafer 1002 and second wafer 1004 may comprise a silicon layer and an insulator layer.

At step 904, the handle layer and the buried oxide of the second wafer are removed. For example, the handle layer may be removed by backgrinding and wet etching, and the buried oxide layer may be removed by etching.

At step 906, a first electrode layer is deposited on the second wafer. In certain embodiments, the first electrode layer can be formed from any electrically conductive material(s) using various techniques on a first side of the piezoelectric material 204. First electrode layer can be formed from one or more layers of metal such as gold, silver, molybdenum, platinum, palladium, iridium, copper, aluminum, titanium, and/or any alloy thereof. In some embodiments, the first electrode layer can be formed from a silicon based material such as silicon and/or silicon nitride that may or may not be doped or coated with a thin layer of metal.

At step 908, a piezoelectric layer is deposited on the second wafer. In certain embodiments, the piezoelectric layer is aluminum nitride.

At step 910, a second electrode layer is deposited on the second wafer. In certain embodiments, the second electrode layer can be formed from any electrically conductive material(s) using various techniques on a second side of the piezoelectric material 204. Second electrode layer can be formed from one or more layers of metal such as gold, silver, molybdenum, platinum, palladium, iridium, copper, aluminum, titanium, and/or any alloy thereof. In some embodiments, the second electrode layer can be formed from a silicon based material such as silicon and/or silicon nitride that may or may not be doped or coated with a thin layer of metal.

At step 912, a first hole is etched in the second electrode layer and the piezoelectric layer in order to expose and provide access to the first electrode layer.

At step 914, a second hole is etched in the second electrode layer, the piezoelectric layer, the first electrode layer, the second wafer, and the insulation layer to expose and provide access to the first wafer.

At step 916, a first conductive metal (e.g., aluminum, copper, or gold) is deposited to the first hole to provide an electrical connection to the first electrode layer.

At step 918, a second conductive metal (e.g., aluminum, copper, or gold) is deposited to the second hole to provide an electrical connection to the first wafer.

At step 920, a third conductive metal (e.g., aluminum, copper, or gold) is deposited on the second electrode layer to provide an electrical connection to the second electrode layer.

At step 922, one or more voids are etched into the second electrode layer. For example, a first void is etched in to isolate the first wafer from the first electrode layer, a second void is etched in to isolate the first electrode layer from the second electrode layer, and a third void is etched in to isolate the second electrode layer from the first electrode layer.

At step 923, one or more openings are etched into the second electrode layer, the piezoelectric layer, the first electrode layer, the second wafer, the insulation layer, and the support structure to isolate the first wafer from the second wafer.

While disclosed as a particular method of fabricating a single ultrasound transducer 120, several other methods of fabricating one or more ultrasound transducers 120 exists. In certain embodiments, first wafer 1002 and/or second wafer 1004 is previously bonded to a component, and the steps to fabricate ultrasound transducer 120 follow attaching the rest of ultrasound transducer to the previously-bonded first wafer 1002 and/or second wafer 1004. For example, first wafer 1002 and/or second wafer 1004 may previously be bonded with processor 150, receiver 130, driver 140, and/or any type of circuitry. Moreover, multiple ultrasound transducers 120 may be fabricated simultaneously by fabricating each ultrasound transducer side-by-side.

FIGS. 10A-H illustrate a cross-sectional pictorial representation for fabricating a rectangular ultrasound transducer 120 with available wire bonding. While illustrated as a rectangular shape, ultrasound transducer 120 may be any shape, such as circular or octagonal. When ultrasound transducer 120 is in a rectangular shape, piezoelectric stack does not need to be wrapped around ultrasound transducer 120 in a circular fashion and instead may be placed longitudinally in ultrasound transducer 120. Accordingly, as FIGS. 10A-H illustrate a rectangular ultrasound transducer 120 in a cross-sectional view, only a single representation of piezoelectric stack 200 (comprising only a single representation of first electrode 202, a single representation of piezoelectric material 204, and a single representation of second electrode 206) is portrayed.

Some embodiments of the ultrasound transducer 120 are produced using different fabrication operations than those pictorially represented in FIGS. 10A-H. For example, ultrasound transducer 120 may be produced to form a circular ultrasound transducer 120.

Moreover, though depicted sequentially as a matter of convenience, the actions shown in FIGS. 10A-H can be performed in a different order and/or performed in parallel. Additionally, some implementations may perform only some of the actions shown. While the pictorial representation illustrates fabricating of a single ultrasound transducer, in practice any number of ultrasound transducers may be simultaneously fabricated to produce a plurality of ultrasound transducers on a die for use in one or more ultrasound sensors 110.

Figure 10A:
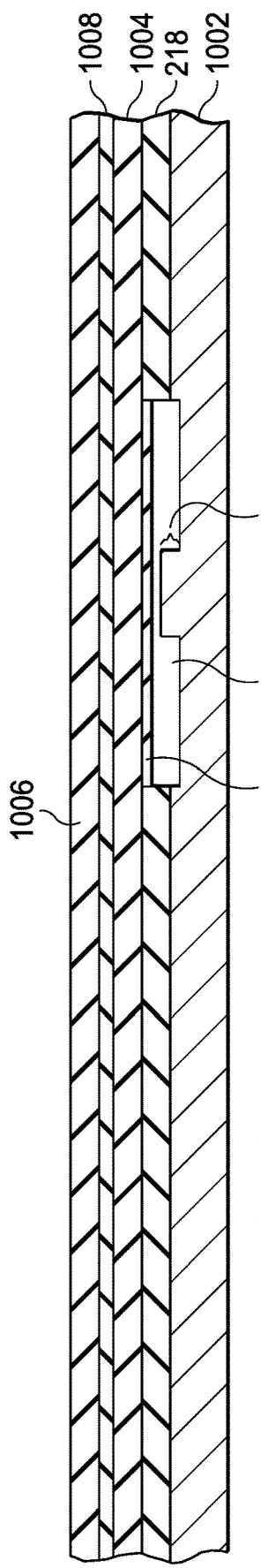
FIGS. 10A-H illustrate a cross-sectional pictorial representation for fabricating an ultrasound transducer.

FIG. 10A illustrates forming gap 224 of ultrasound transducer 120 by bonding first wafer 1002 with second wafer 1004. In particular, first wafer 1002 may have a dual cavity etched to form base structure protrusion 222. The bonding of first water 1002 that has an etched dual cavity with second wafer 1003 forms gap 224. First wafer 502 serves as base structure 220 and second wafer 1004 serves as the top plate 214 of ultrasound transducer 120.

In some embodiments, support structure 218 and insulation layer 216 is provided by local oxidation of silicon in the first wafer 1002 to produce silicon dioxide.

Figure 10B:
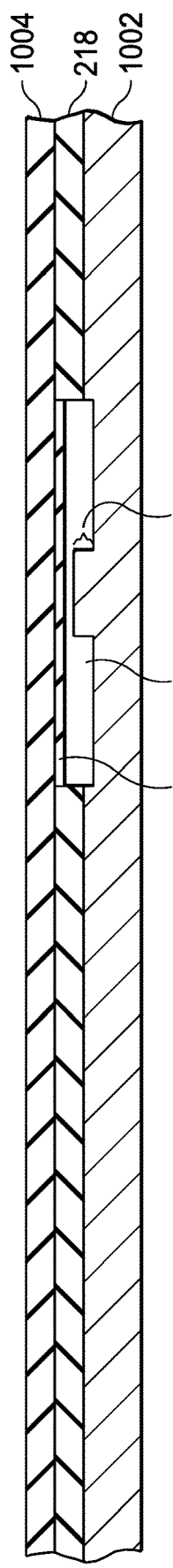

FIG. 10B illustrates a wafer stack resulting from the removal of the handle layer 1006 and buried oxide layer 1008 from the wafer 504. For example, handle layer 1006 may be removed by backgrinding and wet etching. Buried oxide layer 1008 may also be removed by etching.

Figure 10C:
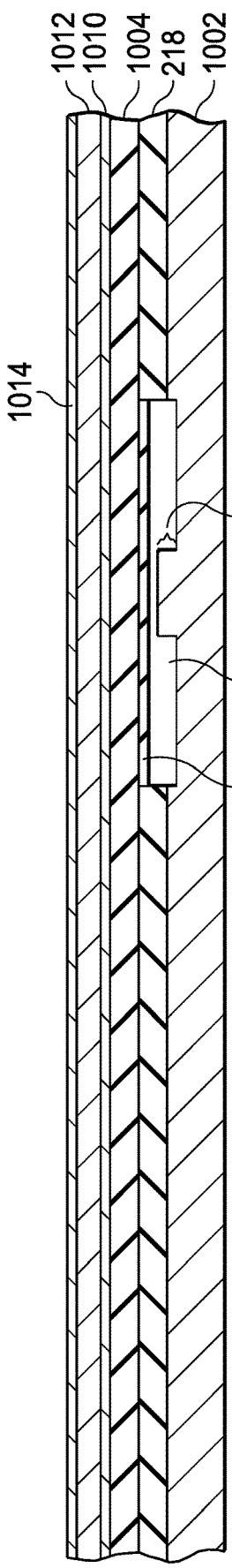

FIG. 10C illustrates a wafer stack resulting from the deposit of first electrode layer 1010, piezoelectric layer 1012, and second electrode layer 1014. First electrode layer 1010 serves as second electrode 206 in ultrasound transducer 120 and may comprise molybdenum. Piezoelectric layer 1012 serves as piezoelectric material 204 in ultrasound transducer 120 and may comprise aluminum nitride. Second electrode layer 1014 serves as second electrode 206 in ultrasound transducer 120 and may comprise molybdenum.

Figure 10D:
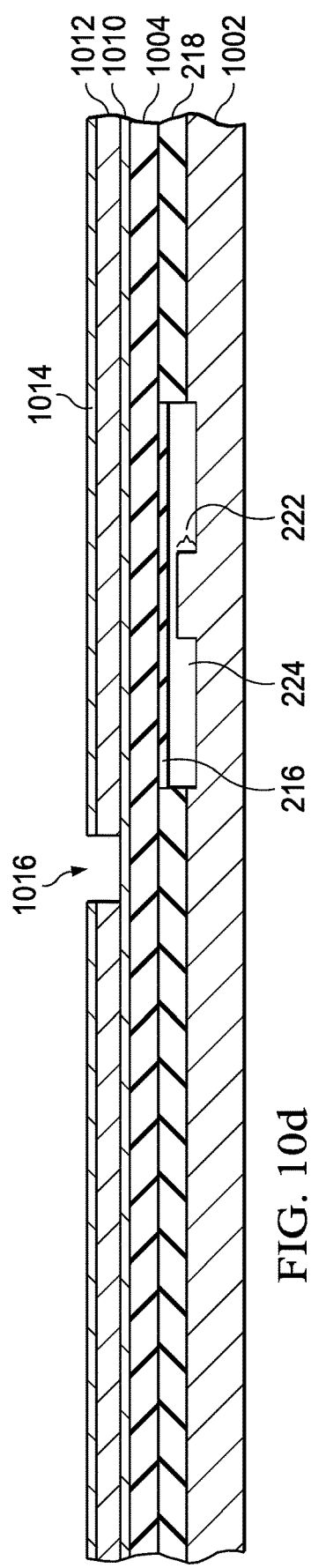

FIG. 10D illustrates a wafer stack with first hole 1016. First hole 1016 is etched from second electrode layer 1014 and piezoelectric layer 1012 in order to expose and provide access to first electrode layer 1010 (which, in certain embodiments, is second electrode 206).

Figure 10E:
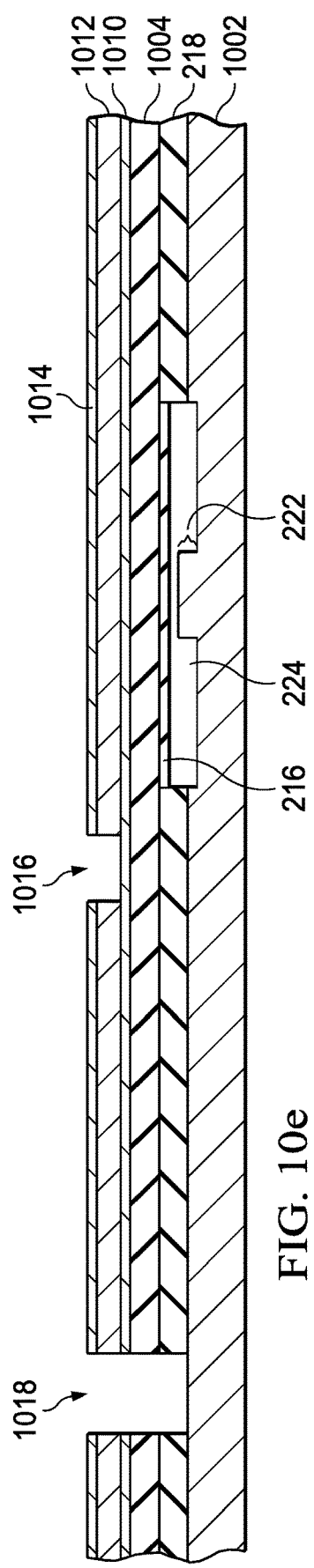

FIG. 10E illustrates a wafer stack with second hole 1018. Second hole 1018 is etched in second electrode layer 1014, piezoelectric layer 1012, first electrode layer 1010, second wafer 1004, insulation layer 216, and support structure 218 in order to expose and provide access to the first wafer 1002 (which, in certain embodiments, is base structure 220).

Figure 10F:
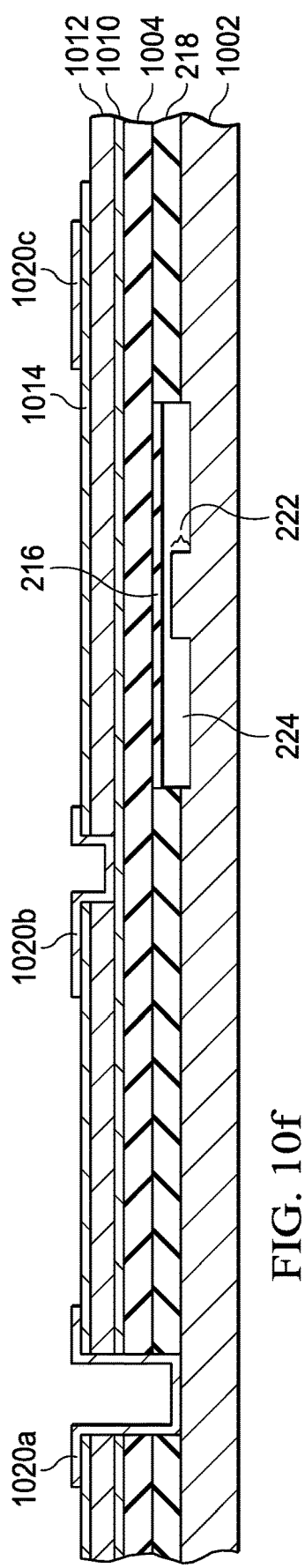

FIG. 10F illustrates a wafer stack resulting from conductive metals 1020*a-c* being deposited in first hole 1016, in second hole 1018, and atop second electrode layer 1014. Conductive metal 1020*a* provides a plated electrical contact with first wafer 1002 (which, in certain embodiments, is base structure 220), conductive metal 1020*b* provides a plated electrical contact with first electrode layer 1010 (which, in certain embodiments, is second electrode 206), and conductive metal 1020*c* provides an electrical contact for second electrode layer 1014 (which, in certain embodiments, is first electrode 202).

Figure 10G:
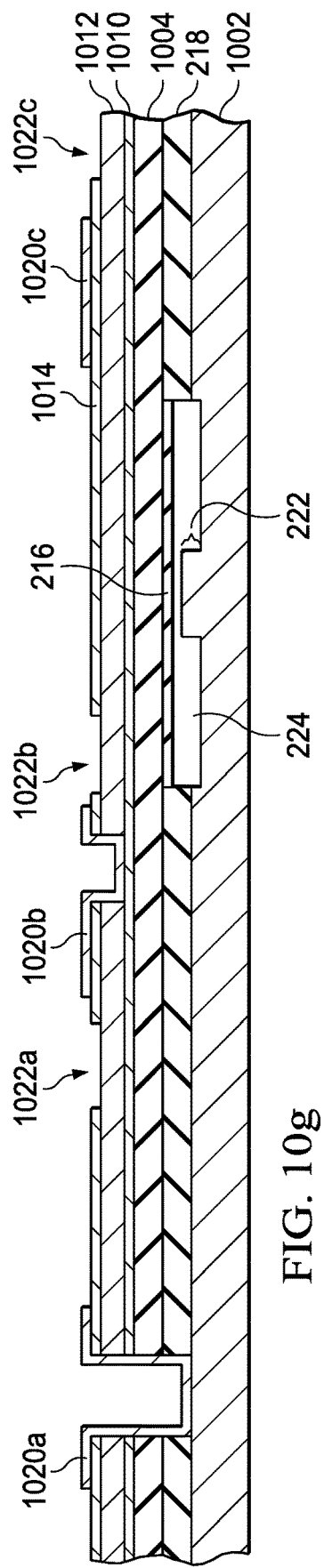

FIG. 10G illustrates voids 1022*a-c* etched in second electrode layer 1014. Void 1022*a* isolates first wafer 1002 from first electrode layer 1010. Void 1022*b* isolates first electrode layer 1010 from second electrode layer 1014. Void 1022*c* isolates second electrode layer 1014 from first electrode layer 1010 (e.g., first electrode layer 1010 of an adjacent ultrasound transducer 120).

Figure 10H:
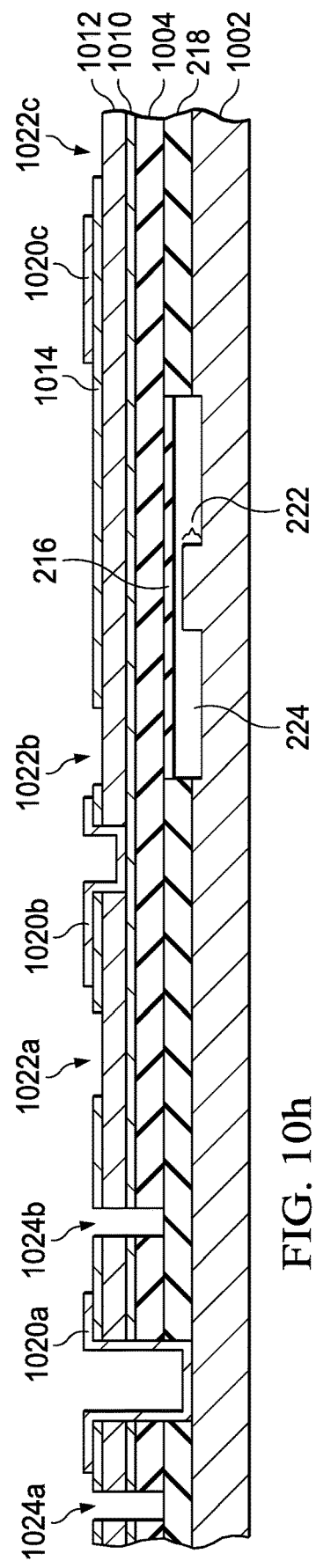

FIG. 10H illustrates openings 1024*a-b* that are etched in second electrode layer 1014, piezoelectric layer 1012, first electrode layer 1010, second wafer 1004, insulation layer 216, and support structure 218 to isolate first wafer 1002 from second wafer 1004.

As illustrated and in certain embodiments, first wafer 1002 serves as base structure 220, first electrode layer 1010 serves as second electrode 206, and second electrode layer 1014 serves as first electrode 202. Moreover, conductive metal 1020*a* provides a plated electrical contact with first wafer 1002 (which, in certain embodiments, is base structure 220), conductive metal 1020*b* provides a plated electrical contact with first electrode layer 1010 (which, in certain embodiments, is second electrode 206), and conductive metal 1020*c* provides an electrical contact for second electrode layer 1014 (which, in certain embodiments, is first electrode 202).

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated otherwise by context.

The scope of this disclosure is not limited to the example embodiments described or illustrated herein. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative. Additionally, although this disclosure describes or illustrates particular embodiments as providing particular advantages, particular embodiments may provide none, some, or all of these advantages.

What is claimed is:

1. A transducer, comprising:
   a first piezoelectric stack comprising a piezoelectric material;
   a first layer in contact with the piezoelectric stack; and
   a base structure beneath the first layer, wherein the transducer is configured to have:
      a gap between the first layer and a first portion of the base structure in an absence of a first bias voltage; and
      contact between the first layer and the first portion of base structure responsive to the first bias voltage.

2. The transducer of claim 1, wherein the first bias voltage is a direct current ("DC") voltage.

3. The transducer of claim 1, wherein the first bias voltage is the voltage difference between the first layer and the base structure.

4. The transducer of claim 1, wherein the first bias voltage is received by the base structure.

5. The transducer of claim 1, wherein the first bias voltage is is received by the first layer.

6. The transducer of claim 1, wherein the first layer does not contact a second portion of the base structure responsive to the first bias voltage received by the transducer.

7. The transducer of claim 1, wherein the first layer comprises a top plate and an insulation layer.

8. The transducer of claim 7, wherein the transducer is configured to have contact between the insulation layer and the first portion of the base structure responsive to the first bias voltage.

9. The transducer of claim 7, wherein the insulation layer does not contact a second portion of the base structure responsive to the first bias voltage.

10. The transducer of claim 1, wherein the piezoelectric stack comprises:
    a first electrode;
    a second electrode; and
    the piezoelectric material is between the first electrode and the second electrode.

11. The transducer of claim 1, wherein the piezoelectric stack is a first piezoelectric stack; and
    further comprising a second piezoelectric stack separate from the first piezoelectric stack and in contact with the first layer.

12. The transducer of claim 1, wherein the transducer is configured to have a gap between the first layer and a second portion of the base structure in an absence of a second bias voltage.

13. The transducer of claim 12, wherein:
    the transducer is configured to have contact between the first layer and the second portion of the base structure responsive to the second bias voltage.

14. The transducer of claim 13, wherein the second bias voltage is received by the base structure.

15. The transducer of claim 13, wherein the second bias voltage is received by the top plate.

16. The transducer of claim 13, wherein the second bias voltage is between the first layer and the base structure.

17. The transducer of claim 1, wherein a support structure connects the base structure with the first layer.

* * * * *